United States Patent
Sako et al.

[11] Patent Number: 5,835,509
[45] Date of Patent: *Nov. 10, 1998

[54] METHOD OF AND APPARATUS FOR RECORDING AND REPRODUCING DATA AND TRANSMITTING DATA

[75] Inventors: Yoichiro Sako, Chiba; Satoshi Otsuka; Tamotsu Yamagami, both of Kanagawa, all of Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 546,507

[22] Filed: Oct. 20, 1995

[30] Foreign Application Priority Data

Oct. 24, 1994 [JP] Japan .................................. 6-258522

[51] Int. Cl.$^6$ ................................................ G06F 11/10
[52] U.S. Cl. ........................................ 371/37.4; 371/39.1
[58] Field of Search ................................ 371/37.7, 37.5, 371/37.4; 369/54, 58; 380/3; 386/109

[56] References Cited

U.S. PATENT DOCUMENTS

| | | | |
|---|---|---|---|
| 4,680,764 | 7/1987 | Suzuki et al. | 371/40 |
| 4,698,810 | 10/1987 | Fukuda et al. | 371/37.7 |
| 4,716,566 | 12/1987 | Masuhara et al. | 371/37.7 |
| 4,719,628 | 1/1988 | Ozaki et al. | 371/50 |
| 4,760,576 | 7/1988 | Sako | 371/40 |
| 4,781,451 | 11/1988 | Sako et al. | 371/37.5 |
| 4,788,685 | 11/1988 | Sako et al. | 371/37.5 |
| 4,802,169 | 1/1989 | Suzuki et al. | 371/38 |
| 4,881,232 | 11/1989 | Sako et al. | 371/37.4 |
| 4,949,326 | 8/1990 | Takagi et al. | 369/54 |
| 4,958,337 | 9/1990 | Yamanaka et al. | 369/58 |
| 5,257,271 | 10/1993 | Lagadec et al. | 371/37.4 |
| 5,272,692 | 12/1993 | Henderson et al. | 369/275.1 |
| 5,287,468 | 2/1994 | Furuhashi et al. | 395/375 |
| 5,325,371 | 6/1994 | Maeda et al. | 371/37.5 |
| 5,408,531 | 4/1995 | Nakajima | 380/3 |
| 5,438,560 | 8/1995 | Lee | 369/58 |
| 5,585,933 | 12/1996 | Ichige et al. | 386/109 |

FOREIGN PATENT DOCUMENTS

| | | | |
|---|---|---|---|
| 60-201575 | 10/1985 | Japan | G11B 20/18 |
| 61-46624 | 3/1986 | Japan | H03M 13/00 |
| 62-161221 | 7/1987 | Japan | H03M 13/00 |
| 62-236185 | 10/1987 | Japan | G11B 20/18 |
| 62-248313 | 10/1987 | Japan | H03M 13/00 |
| 62-283472 | 12/1987 | Japan | G11B 27/10 |
| 63-20921 | 1/1988 | Japan | H03M 13/00 |

OTHER PUBLICATIONS

E. Fujiwara et al., "Cross–Interleave Reed–Solomon Code," Applications To Computer Systems, (1990), #XP 002048536, pp. 237–245.

*Primary Examiner*—Todd Subawn
*Assistant Examiner*—Fred F. Tzeng
*Attorney, Agent, or Firm*—Limbach & Limbach LLP

[57] ABSTRACT

First error-processing data are generated with respect to a predetermined amount of data, and second error-processing data are generated with respect to each of a plurality of blocks produced by dividing the predetermined amount of data. Data of record units are generated from the predetermined amount of data, the first error-processing data, and the second error-processing data. The data of record units are recorded on and reproduced from a recording medium. Errors are corrected in the predetermined amount of data in the reproduced data of record units with the first error-processing data with respect to each of the record units. If errors cannot be corrected, at least errors are detected in the predetermined amount of data in each of the blocks with the second error-processing data. If errors are detected in N (N is a positive integer) successive blocks, all data in at least one block which is not positioned at an end of the N successive blocks are regarded as being erased, thereby correcting errors in the predetermined amount of data in the record units with the first error-processing data, thus producing reproduced data.

24 Claims, 18 Drawing Sheets

FIG. 5

| NAME OF REGION | STARTING RADIUS(mm) | ENDING RADIUS(mm) | DATA CLOCK |
|---|---|---|---|
| GCP REGION | 41.9980mm | 41.2180mm | 24.192MHz |
| CNT REGION | 41.2144mm | 41.2096mm | 24.192MHz |
| TEST REGION | 41.2060mm | 41.2012mm | 24.192MHz |
| BAND0 | 41.2000mm | 41.1836mm | 24.192MHz |
| BAND1 | 39.1824mm | 39.1468mm | 23.688MHz |
| BAND2 | 38.1456mm | 38.0908mm | 23.184MHz |
| BAND3 | 37.0896mm | 36.9964mm | 22.680MHz |
| BAND4 | 36.9952mm | 35.8636mm | 21.672MHz |
| BAND5 | 35.8624mm | 34.6924mm | 21.168MHz |
| BAND6 | 34.6912mm | 33.4636mm | 20.160MHz |
| BAND7 | 33.4624mm | 32.1964mm | 19.656MHz |
| BAND8 | 32.1952mm | 30.8524mm | 18.648MHz |
| BAND9 | 30.8512mm | 29.4316mm | 17.640MHz |
| BAND10 | 29.4304mm | 27.9724mm | 17.136MHz |
| BAND11 | 27.9712mm | 26.4172mm | 16.128MHz |
| BAND12 | 26.4160mm | 24.7468mm | 15.120MHz |
| BAND13 | 24.7456mm | 22.9612mm | 14.112MHz |
| BAND14 | 22.9600mm | 20.9260mm | 12.600MHz |
| BAND15 | 20.9248mm | 20.0020mm | 12.096MHz |
| TEST REGION | 20.0008mm | 19.9960mm | 12.096MHz |
| CNT REGION | 19.9924mm | 19.9876mm | 12.096MHz |
| GCP REGION | 19.9840mm | 19.0000mm | 12.096MHz |

FIG. 6A

| i | j 0 | 1 | ---- 7 | 8 | 9 | 10 | 11 | 12 | 13 | 14 | 15 |
|---|---|---|---|---|---|---|---|---|---|---|---|
| 130 | D0 | D1 | D7 | D8 | D9 | D10 | D11 | D12 | D13 | D14 | D15 |
| 129 | D16 | D17 | D23 | D24 | D25 | D26 | D27 | D28 | D29 | D30 | D31 |
| 128 | D32 | D33 | D39 | D40 | D41 | D42 | D43 | D44 | D45 | D46 | D47 |
| 127 | D48 | D49 | D55 | D56 | D57 | D58 | D59 | D60 | D61 | D62 | D63 |
| 126 | D64 | D65 | D71 | D72 | D73 | D74 | D75 | D76 | D77 | D78 | D79 |
| 125 | D80 | D81 | D87 | D88 | D89 | D90 | D91 | D92 | D93 | D94 | D95 |
| 124 | D96 | D97 | D103 | D104 | D105 | D106 | D107 | D108 | D109 | D110 | D111 |
| 123 | D112 | D113 | D119 | D120 | D121 | D121 | D123 | D124 | D125 | D126 | D127 |

147 CODE WORDS

FIG. 6B

| j\i | 0 | 1 | ... | 7 | 8 | 9 | 10 | 11 | 12 | 13 | 14 | 15 |
|---|---|---|---|---|---|---|---|---|---|---|---|---|
| 4 | D2016 | D2017 | | D2023 | D2024 | D2025 | D2026 | D2027 | D2028 | D2029 | D2030 | D2031 |
| 3 | D2032 | D2033 | | D2039 | D2040 | D2041 | D2042 | D2043 | D2044 | D2045 | D2046 | D2047 |
| 2 | P1 | P2 | | P8 | P9 | P10 | P11 | P12 | P13 | P14 | P15 | P16 |
| 1 | P17 | P18 | | P24 | P25 | P26 | P27 | P28 | P29 | P30 | P31 | P32 |
| 0 | P33 | P34 | | Q4 | CRC1 | CRC2 | CRC3 | CRC4 | CRC5 | CRC6 | CRC7 | CRC8 |
| −1 | E1,1 | E2,1 | | E8,1 | E9,1 | E10,1 | E11,1 | E12,1 | E13,1 | E14,1 | E15,1 | E16,1 |
| −2 | E1,2 | E2,2 | | E8,2 | E9,2 | E10,2 | E11,2 | E12,2 | E13,2 | E14,2 | E15,2 | E16,2 |
| −3 | E1,3 | E2,3 | | E8,3 | E9,3 | E10,3 | E11,3 | E12,3 | E13,3 | E14,3 | E15,3 | E16,3 |
| −4 | E1,4 | E2,4 | | E8,4 | E9,4 | E10,4 | E11,4 | E12,4 | E13,4 | E14,4 | E15,4 | E16,4 |

147 CODE WORDS

| P1 | P2 | P3 | P4 | P5 | P6 | P7 | P8 | P9 | P10 | P11 | P12 | P13 | P14 | P15 | P16 |
| P17 | P18 | P19 | P20 | P21 | P22 | P23 | P24 | P25 | P26 | P27 | P28 | P29 | P30 | P31 | P32 |
| P33 | P34 | P35 | P36 | Q1 | Q2 | Q3 | Q4 | CRC1 | CRC2 | CRC3 | CRC4 | CRC5 | CRC6 | CRC7 | CRC8 |

| | -13 | -14 | -15 | -16 |
|---|---|---|---|---|
| | E1,13 | E1,14 | E1,15 | E1,16 |
| | E2,13 | E2,14 | E2,15 | E2,16 |
| | ... | ... | ... | ... |
| | E8,13 | E8,14 | E8,15 | E8,16 |
| | E9,13 | E9,14 | E9,15 | E9,16 |
| | E10,13 | E10,14 | E10,15 | E10,16 |
| | E11,13 | E11,14 | E11,15 | E11,16 |
| | E12,13 | E12,14 | E12,15 | E12,16 |
| | E13,13 | E13,14 | E13,15 | E13,16 |
| | E14,13 | E14,14 | E14,15 | E14,16 |
| | E15,13 | E15,14 | E15,15 | E15,16 |
| | E16,13 | E16,14 | E16,15 | E16,16 |

| NUMBER OF LINES | DATA | PARITY | |
|---|---|---|---|
| 7 | i = 130~124 | P 1 | P 2 |
| 8 | i = 123~116 | P 3 | P 4 |
| 7 | i = 115~109 | P 5 | P 6 |
| 7 | i = 108~102 | P 7 | P 8 |
| 8 | i = 101~94 | P 9 | P 10 |
| 7 | i = 93~87 | P 11 | P 12 |
| 7 | i = 86~80 | P 13 | P 14 |
| 8 | i = 79~72 | P 15 | P 16 |
| 7 | i = 71~65 | P 17 | P 18 |
| 7 | i = 64~58 | P 19 | P 20 |
| 8 | i = 57~50 | P 21 | P 22 |
| 7 | i = 49~43 | P 23 | P 24 |
| 7 | i = 42~36 | P 25 | P 26 |
| 8 | i = 35~28 | P 27 | P 28 |
| 7 | i = 27~21 | P 29 | P 30 |
| 7 | i = 20~14 | P 31 | P 32 |
| 8 | i = 13~6 | P 33 | P 34 |
| 7 | i = 5~-1 | P 35 | P 36 |
| 7 | i = -2~-8 | P 37 | P 38 |
| 8 | i = -9~-16 | P 39 | P 40 |

METHOD OF AND APPARATUS FOR RECORDING AND REPRODUCING DATA AND TRANSMITTING DATA

BACKGROUND OF THE INVENTION

1. Field of the Invention

The present invention relates to a method of and an apparatus for recording, reproducing and transmitting data.

2. Description of the Related Art

Optical disks which have heretofore been proposed include a magneto-optical disk, an optical disk as a phase-change medium, a write-once disk, a read-only optical disk, etc. These optical disks can roughly be classified into writable disks and read-only disks.

If a defective sector is detected on a magneto-optical disk which is a writable disk in a disk certifying process at the time it is manufactured, then a sector positioned adjacent to the defective sector is used as a replacement sector for the defective sector, and information as to the replacement sector is recorded in a given area on the magneto-optical disk. When the magneto-optical disk is played back, the replacement sector is used instead of the defective sector. If a new defective sector is produced on the magneto-optical disk after it is shipped, a replacement sector for the defective sector is established in a region dedicated for the replacement sector, and data to be recorded in the defective sector is recorded in the replacement sector, and its information is recorded in a given area on the magneto-optical disk.

No data is recorded on a read-only optical disk by an optical disk drive. It is well known in the art that when a read-only optical disk is manufactured, data is recorded to it, and after it is shipped, the data which was recorded on the read-only optical disk at the time it was manufactured is read only.

When data is recorded on a magneto-optical disk by an optical disk drive or data is recorded on a read-only optical disk when it is manufactured, parity bits such as error-correcting parity bits and error-checking parity bits such as cyclic redundancy check (CRC) bits are added to the data. When the recorded data is reproduced from the magneto-optical disk or the read-only optical disk, the data is subjected to an error-checking process and an error-correcting process using those parity bits.

One known parity system is a Reed-Solomon code. According to the Reed-Solomon code, if one symbol is composed of eight bits and data of k symbols, then a parity bit is added to the k symbols, resulting in a code of n symbols. The term which represents the correcting ability of the error-correcting code is "minimum distance".

For example, if one symbol is represented by one bit, then the n symbols are represented by n bits, and hence there are $2^n$ binary data strings available for the n symbols to assume. Without the parity bits, there are $2^k$ binary data strings available for the k symbols to assume. The $2^k$ binary data strings are taken from the $2^n$ binary data strings, and if there are different d bits between any two data strings, then "d" is referred to as a "distance". A minimum one of the distances determined with respect to all the $2^k$ binary data strings is referred to as a "minimum distance". The term "minimum distance" will hereinafter be referred to as a "distance".

The distance d of a code for correcting t1 errors is generally required to satisfy the following formula (1):

$$d \geq 2t1 + 1 \qquad (1)$$

If the distance d is "17", for example, then t1 is 8. That is, the code can correct up to 8 symbols.

The code is also capable of detecting errors as well as correcting errors. If the number of errors that can be detected by the error-detecting capability of the code is t2, then the number t2 of detectable errors is expressed by the following equation (2):

$$t2 = d - (2t1 + 1) \quad (t2 \geq 0) \qquad (2)$$

For example, the number t1 of correctable errors and the number t2 of detectable errors in the case where the distance d is "17" are given in the following table 1:

0 symbol correction . . . t1=0, t2=16
1 symbol correction . . . t1=1, t2=14
2 symbol correction . . . t1=2, t2=12
3 symbol correction . . . t1=3, t2=10
4 symbol correction . . . t1=4, t2=8
5 symbol correction . . . t1=5, t2=6
6 symbol correction . . . t1=6, t2=4
7 symbol correction . . . t1=7, t2=2
8 symbol correction . . . t1=8, t2=0 . . . (Table 1)

As can be seen from the table 1 above, since the number of detectable errors is "0" for the 8 symbol correction, it will not be able to detect errors properly if errors of 9 symbols or more are generated for the 8 symbol correction. If the distance d is of an increased value, then the number of detectable errors is increased while the ability to detect errors is maintained. The Reed-Solomon code thus constructed is also referred to as a long distance code (LDC) (n, k, d), which is so called because the distance d is relatively large.

On magneto-optical disks, read-only optical disks, or the like, data is recorded after the above Reed-Solomon code has been constructed. When the recorded data is reproduced, random errors or a burst of errors having a length depending on the distance d the number t1 of correctable errors, and the number t2 of detectable errors can all be corrected by the Reed-Solomon code.

As shown in Table 1 above, if the distance d is "17", then the number of correctable errors is 8 at maximum. Therefore, if a burst of 9 successive errors or more occurs, then the errors cannot be corrected, and data with the errors is reproduced as it is.

Various error-correcting processes have been employed for writable disks such as magneto-optical disks. According to one process, if there is a defective sector on a writable disk, it is replaced with a replacement sector, and data is recorded in the replacement sector so that it can be reproduced properly. According to another process, in order to cope with a burst of errors, a parity sector is included in each circumferential track or every set of circumferential tracks on a writable disk, and parity data produced when data in other sectors in each circumferential track or every set of circumferential tracks are exclusive-ORed are recorded in the parity sector. When a burst of errors occurs in the data, the burst of errors is corrected based on the parity data read from the parity sector.

When data which is to be processed on a real-time basis, such as moving-image data, is handled, the former process which uses replacement sectors poses a problem in that the processing speed is slowed by the use of replacement sectors. The latter process of correcting errors on the writable disk with parity sectors is also disadvantageous in that the time required to correct a burst of errors is long because when a burst of errors occurs in an area composed of sectors in a circumferential track or in a set of circumferential tracks, it is necessary to read the data from the area again, and correct the burst of errors based on the re-read data and the parity data recorded in the parity sector.

On read-only optical disks, no replacement sectors can be employed. If large errors such as a burst of errors occur when data is reproduced from a read-only optical disk, then the errors need to be corrected with an increased distance d or parity sectors insofar as only a prerecorded error-correcting code is relied upon. The increased distance d has problems in that it increases the redundancy of the code and the processing time. The increased redundancy of the code results in a corresponding reduction in the capacity of the read-only optical disk to record data. Correcting errors on the read-only optical disk with parity sectors is also disadvantageous in that the time required to process a burst of errors is long because when a burst of errors occurs in an area composed of sectors in a circumferential track or every set of circumferential tracks, it becomes necessary to reproduce the data from the area again, and to correct the burst of errors based on the data which has been reproduced again and the parity data recorded in the parity sector.

SUMMARY OF THE INVENTION

It is therefore an object of the present invention to provide a method of and an apparatus for recording, reproducing and transmitting data efficiently to allow data to be reproduced and transmitted without reducing the capacity to record data, even if a burst of errors occurs.

According to an aspect of the present invention, there is provided a method of recording and reproducing data, comprising the steps of: (a) generating first error-processing data with respect to a predetermined amount of consecutive data, and generating second error-processing data with respect to each of a plurality of blocks produced by dividing the predetermined amount of consecutive data; (b) generating record units of data from each of the following: the predetermined amount of consecutive data, the first error-processing data, and the second error-processing data; (c) recording each record unit of data on a recording medium, (d) reproducing each record unit of data from the recording medium; (e) processing error-correction in the predetermined amount of consecutive data in each reproduced record unit of data using the first error-processing data with respect to each record unit of data; (f) if errors cannot be corrected in step (e), at least detecting errors in the predetermined amount of consecutive data in each of the blocks with the second error-processing data; and (g) if errors are detected in N (N is a positive integer) successive blocks, processing error-correction in the record unit of data in the predetermined amount of consecutive data with the first error-processing data regarding all of the data in at least one block of the N successive blocks which are not positioned at an end of the N successive blocks as erased data, so as to produce reproduced data.

According to another aspect of the present invention, there is provided a method of transmitting data, comprising the steps of: (a) generating first error-processing data with respect to a predetermined amount of consecutive data, and generating second error-processing data with respect to each of a plurality of blocks produced by dividing the predetermined amount of consecutive data; (b) generating a unit of transmission data from each of the following: the predetermined amount of consecutive data, the first error-processing data, and the second error-processing data; (c) transmitting each unit of transmission data; (d) processing error-correction in the transmission data which has been transmitted with the first error-processing data with respect to each transmitted unit; (e) if errors cannot be corrected in step (d), at least detecting errors in the transmitted data in each of the blocks with the second error-processing data; and (f) if errors are detected in N (N is an integer of at least 3) successive blocks, processing error-correction in the predetermined amount of consecutive data in each transmitted unit with the first error-processing data regarding all data in at least one block which is not positioned at an end of the N successive blocks as erased data.

According to still another aspect of the present invention, there is provided an apparatus for recording and reproducing data. The apparatus is made up of error-processing data generating means for generating first error-processing data with respect to a predetermined amount of consecutive data, and second error-processing data with respect to each of a plurality of blocks produced by dividing the predetermined amount of consecutive data. The apparatus further comprises record unit data generating means for generating record units of data from the predetermined amount of consecutive data, the first error-processing data and the second error-processing data, recording and reproducing means for recording the record units of data on a recording medium and reproducing the record units of data from the recording medium, and error correcting means for processing error-correction with respect to the predetermined amount of consecutive data in the record units of data reproduced by the recording and reproducing means with the first error-processing data. If errors cannot be corrected, the apparatus will at least detect errors in the predetermined amount of consecutive data in each of the blocks with the second error-processing data, and if errors are detected in N (N is a positive integer) successive blocks, it will process error-correction in the predetermined amount of consecutive data in the record unit with the first error-processing data, regarding all data in at least one block which is not positioned at an end of the N successive blocks as erased data.

According to still another aspect of the present invention, there is provided an apparatus for transmitting data. The apparatus comprises error-processing data generating means for generating first error-processing data with respect to a predetermined amount of consecutive data, and second error-processing data with respect to each of a plurality of blocks produced by dividing the predetermined amount of consecutive data; transmission data generating means for generating a unit of transmission data from each of the following: the predetermined amount of consecutive data, the first error-processing data, and the second error-processing data; transmitting means for transmitting each unit of the transmission data; and error correcting means for processing error-correction with respect to each unit of the transmission data which has been transmitted with the first error-processing data. If errors cannot be corrected, the apparatus will at least detect errors in the transmitted data in each of the blocks with the second error-processing data, and if errors are detected in N (N is an integer of at least 3) successive blocks, it will then process error-correction in the predetermined amount of consecutive data in the transmitted unit with the first error-processing data, regarding all data in at least one block of the N successive blocks, which is not positioned at an end of the N successive blocks, as erased data.

According to a further aspect of the present invention, there is provided a method of reproducing data, comprising the steps of: (a) reproducing a record unit of data from a recording medium on which there are recorded a predetermined amount of consecutive data, first error-processing data generated with respect to the predetermined amount of consecutive data, and second error-processing data generated with respect to each of a plurality of blocks produced by dividing the predetermined amount of data, making up the data of record unit; (b) processing error-correction in the predetermined amount of consecutive data in the reproduced record units of data with the first error-processing data with respect to each of the record units; (c) if errors cannot be corrected in step (b), at least detecting errors in the predetermined amount of consecutive data in each of the blocks with the second error-processing data; and (d) if errors are detected in N (N is a positive integer) successive blocks, processing error-correction in the record units of the predetermined amount of consecutive data with the first error-processing data, regarding all of the data in at least one block of the N successive blocks which is not positioned at an end of the N successive blocks, as erased data, so as to produce reproduced data.

According to yet another aspect of the present invention, there is provided a method of transmitting data, comprising the steps of: (a) transmitting each unit of transmission data which is composed of a predetermined amount of consecutive data, first error-processing data generated with respect to the predetermined amount of consecutive data, and second error-processing data generated with respect to each of a plurality of blocks produced by dividing the predetermined amount of consecutive data; (b) processing error-correction in each unit of the transmission data which is transmitted with the first error-processing data with respect to each transmitted unit; (c) if errors cannot be corrected in step (b), at least detecting errors in the transmission data in each of the blocks with the second error-processing data; and (d) if errors are detected in N (N is an integer of at least 3) successive blocks, processing error-correction in the transmitted units of the predetermined amount of consecutive data with the first error-processing data, regarding all of the data in at least one block which is not positioned at an end of the N successive blocks, as erased data.

According to still another aspect of the present invention, there is provided an apparatus for reproducing data, comprising: reproducing means for reproducing a record unit of data from a recording medium on which there are recorded a predetermined amount of consecutive data, first error-processing data generated with respect to the predetermined amount of consecutive data, and second error-processing data generated with respect to each of a plurality of blocks produced by dividing the predetermined amount of consecutive data making up the record units of data, error-correction processing means for processing error-correction in the predetermined amount of consecutive data in the record unit of data which is reproduced by the reproducing means, with the first error-processing data with respect to each of the record units, and if errors cannot be corrected, at least detecting errors in the predetermined amount of consecutive data in each of the blocks with the second error-processing data, and if errors are detected in N (N is a positive integer) successive blocks, processing error-correction in the predetermined amount of consecutive data in the record unit with the first error-processing data, regarding all data in at least one block, which is not positioned at an end of the N successive blocks, as erased data.

According to still another aspect of the present invention, there is provided an apparatus for recording and reproducing data, comprising: error-processing data generating means for generating first error-processing data with respect to a predetermined amount of consecutive data, and second error-processing data with respect to each of a plurality of blocks produced by dividing the predetermined amount of consecutive data; record unit data generating means for generating record units of data from the predetermined amount of consecutive data, the first error-processing data, and the second error-processing data; recording and reproducing means for recording the record units of data on a recording medium and reproducing the record units of data from the recording medium; error detecting means for detecting an error status, [based on a video level of the reproduced signal] in each of the blocks of a reproduced signal indicative of the record unit of data which is reproduced by the recording and reproducing means; and error-correction processing means for processing error-correction in the predetermined amount of consecutive data in the record unit of data reproduced by the recording and reproducing means, with the first error-processing data with respect to each of the record units, and if errors cannot be corrected with the first error-processing data with respect to each record unit, determining blocks as errors based on the error status detected by the error detecting means, and when N (N is a positive integer) successive blocks are determined as errors, processing error-correction in the predetermined amount of data in the record units with the first error-processing data regarding all data in at least one block, which is not positioned at an end of the N successive blocks, as being erased.

According to yet another aspect of the present invention, there is provided an apparatus for reproducing data, comprising: reproducing means for reproducing record units of data from a recording medium on which there are recorded a predetermined amount of consecutive data, first error-processing data generated with respect to the predetermined amount of consecutive data, and second error-processing data generated with respect to each of a plurality of blocks produced by dividing the predetermined amount of consecutive data, making up the record units of data; error detecting means for detecting an error status in each of the blocks of a reproduced signal indicative of the record unit of data which is reproduced by the reproducing means, based on a video level of the reproduced signal; and error-correction processing means for processing error-correction in the predetermined amount of consecutive data in the record unit of data reproduced by the reproducing means, with the first error-processing data with respect to each the record unit, and if errors cannot be corrected, determining blocks as errors based on the error status detected by the error detecting means, and when N (N is a positive integer) successive blocks are determined as errors, processing error-correction in the predetermined amount of data in the record unit with the first error-processing data, regarding all data in at least one block, which is not positioned at an end of the N successive blocks, as erased data.

BRIEF DESCRIPTION OF THE DRAWINGS

FIG. 5 is a diagram showing areas on the optical disk shown in FIG. 4 and data clock frequencies used in those areas;

FIGS. 6A, 6B, and 6C are diagrams showing a sector format the optical disk shown in FIG. 4;

FIG. 7 is a diagram illustrative of the addition of parity data as a second error correction code (ECC) in a pattern of 7 lines—8 lines—7 lines on an optical disk according to the present invention;

DETAILED DESCRIPTION OF THE PREFERRED EMBODIMENTS

Figure 1:
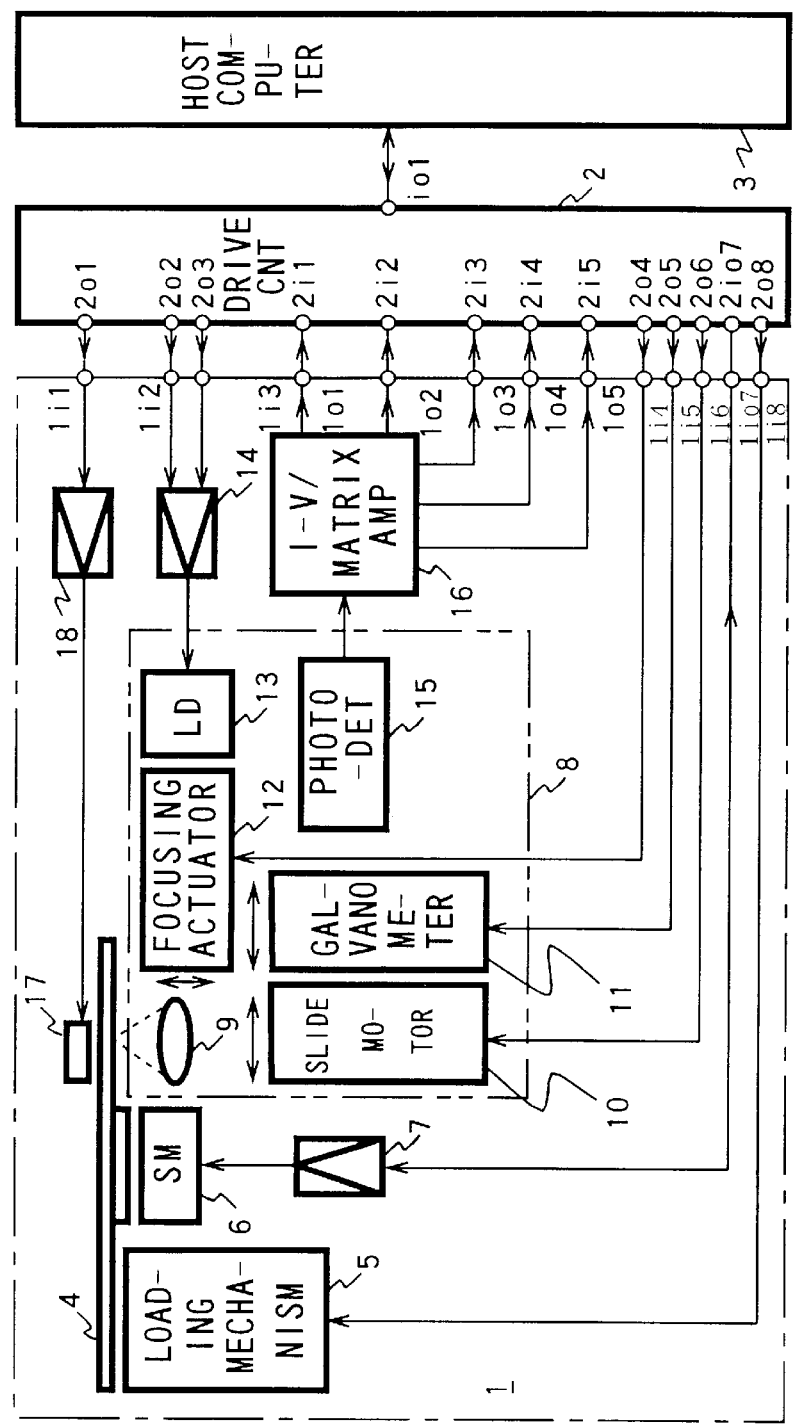
FIG. 1 is a block diagram of an optical disk drive according to the present invention.

FIG. 1 shows, by way of example, an arrangement of an optical disk drive according to the present invention. The optical disk drive is capable of recording data on and reproducing data from a magneto-optical disk and a write-once disk, reading data from a read-only optical disk, writing data on and reading data from a writable/readable area on a so-called partial read-only memory (ROM), and reading data from a read-only area on such a partial ROM.

As shown in FIG. 1, the optical disk drive includes a drive 1 for recording data on and reading data from an optical disk 4, a drive controller 2 for controlling the drive 1, and a host computer 3 connected to the drive controller 2 through a Small Computer Systems Interface (SCSI) input/output terminal iol, for accessing the optical disk 4 through the drive controller 2.

The optical disk 4 may comprise a magneto-optical disk, an optical disk such as a phase-change medium, a write-once disk, a partial disk having a writable area (RAM) and a read-only area (ROM), a read-only optical disk, or the like.

The drive 1 comprises a loading mechanism 5 for loading the optical disk 4, a spindle motor 6 for rotating the optical disk 4 which has been loaded by the loading mechanism 5, a driver 7 for energizing the spindle motor 6, an optical block 8, a driver 14 for energizing a laser diode 13 in the optical block 8, a current-voltage (I-V)/matrix amplifier 16 for converting a reproduced signal from the optical block 8 from a current signal into a voltage signal and supplying the voltage signal to a plurality of systems, a magnetic head 17 for applying a magnetic field to the optical disk 4, and a driver 18 for energizing the magnetic head 17. The I-V/matrix amplifier 16 produces a radio frequency (RF) signal and an magneto-optical (MO) signal by combining a plurality of output signals from a photodetector 15 in the optical block 8.

The optical block 8 comprises an objective lens 9 for applying a laser beam to the optical disk 4 and applying a laser beam reflected from the optical disk 4 to a photodetector 15, a slide motor 10 for moving the optical block 8 radially with respect to the optical disk 4, a galvanometer motor 11 for tracking the optical block 8, a focus actuator 12 for focusing the laser beam on the optical disk 4, a laser diode 13 for emitting the laser beam to be applied to the optical disk 4 by the objective lens 9, and a photodetector 15 for detecting the laser beam emitted from the laser diode 13.

The driver 18 for energizing the magnetic head 17 is connected through an input terminal $1i1$ to an output terminal $2o1$ of the drive controller 2. The driver 14 for energizing the laser diode 13 is connected through input terminals $1i2$ and $1i3$ to output terminals $2o2$ and $2o3$ of the drive controller 2. The I-V matrix amplifier 16 is connected through output terminals $1o1$, $1o2$, $1o3$, $1o4$, $1o5$ to input terminals $2i1$, $2i2$, $2i3$, $2i4$ and $2i5$, respectively, of the drive controller 2. The focus actuator 12 is connected through an input terminal $1i4$ to an output terminal $2o4$ of the drive controller 2. The galvanometer motor 11 is connected through an input terminal $1i5$ to an output terminal $2o5$ of the drive controller 2. The slide motor 10 is connected through an input terminal $1i6$ to an output terminal $2o6$ of the drive controller 2. The driver 7 for energizing the spindle motor 6 is connected through an input/output terminal $1io7$ to an input/output terminal $2io7$ of the drive controller 2. The loading mechanism 5 is connected through an input terminal $1i7$ to an output terminal $2o7$ of the drive controller 2.

A process for transmitting and receiving commands and data is carried out by the drive controller 2. For recording data, the drive controller 2 adds CRC bits and an error-correcting code to the data from the host computer 3, and transmits the data to the drive 1. For reproducing data, the drive controller 2 corrects errors in data from the drive 1, and transfers only user data to the host computer 3. When the data is recorded and reproduced, the drive controller 2 issues commands to a servo control system and the various blocks in the drive 1.

Figure 2:
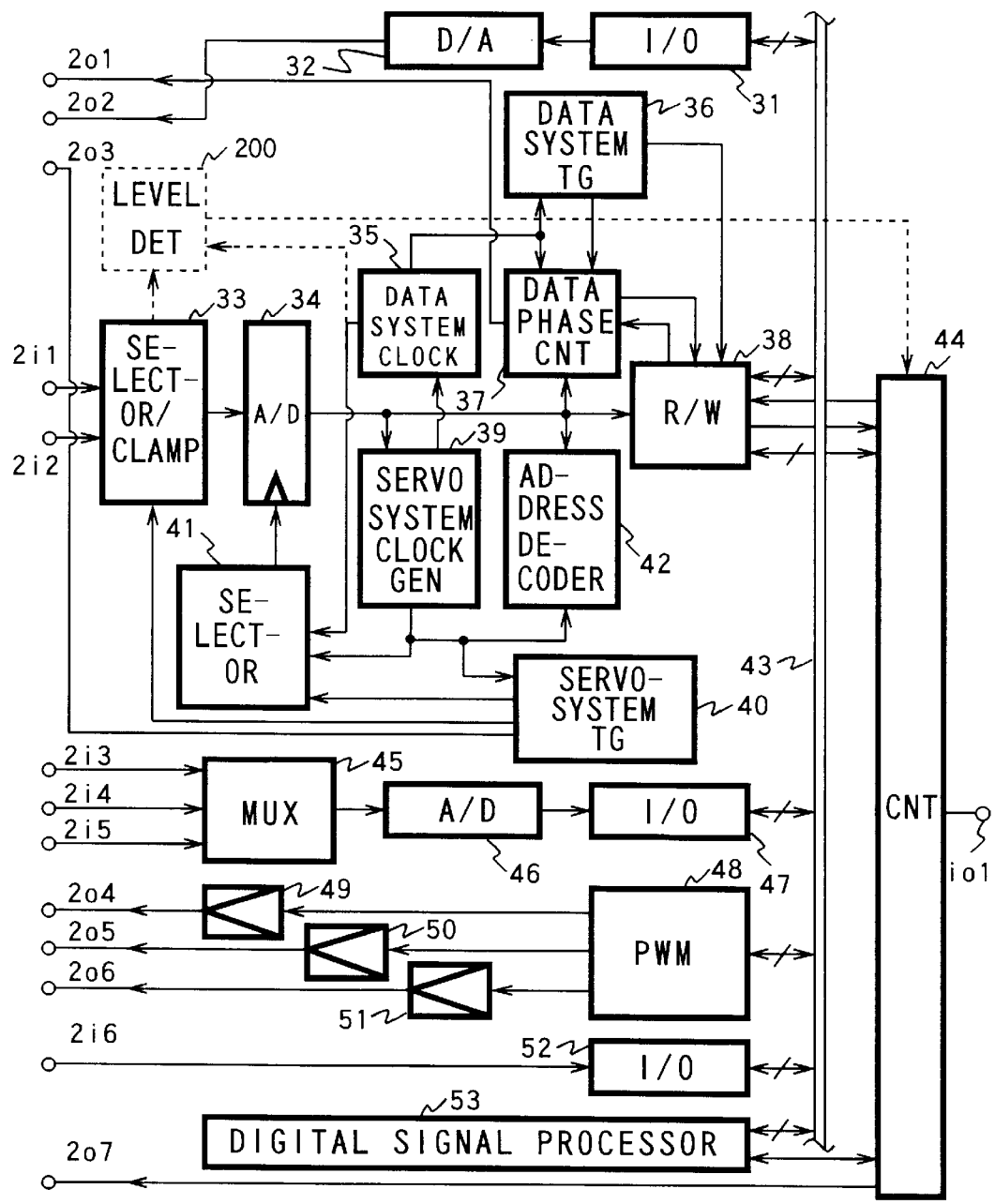
FIG. 2 is a block diagram of a drive controller in the optical disk drive shown in FIG. 1.

FIG. 2 illustrates, by way of example, an arrangement of the drive controller 2 shown in FIG. 1.

As shown in FIG. 2, the drive controller 2 has an input/output circuit 31 for supplying bias data for the laser diode 13, which has been supplied from a digital signal processor 53 through a bus 43, through a digital/analog (D/A) converter 32 and the output terminal $2o2$ to the driver 14 shown in FIG. 1. The drive controller 2 also has a selector/clamp circuit 33 for selecting output signals supplied from the I-V/matrix amplifier 16 (FIG. 1) through the input terminals $2i1$ and $2i2$ based on a timing signal from a servo control system timing generator 40, and clamping a selected output signal. An analog/digital (A/D) converter 34 converts an output signal from the selector/clamp circuit 33 into digital data based on a servo system clock signal or a data system clock signal selected by and supplied from a clock selector 41.

A data system clock generator 35 generates a data system clock signal based on a servo system clock signal from a servo system clock generator 39. A data system timing generator 36 generates a data system timing signal based on the data system clock signal. Based on reference phase data extracted from reproduced data from the A/D converter 34, a data phase control circuit 37 controls the phase of the data system clock signal from the data system clock generator 35, supplies the phase-controlled data system clock signal as a reading clock signal to a reading/writing circuit 38, controls the phase of a writing position control signal from the reading/writing circuit 38, and outputs the phase-controlled writing position control signal through the output terminal $2o1$.

When data is reproduced, the reading/writing circuit 38 responds to a request signal from a controller 44 to supply output data from the A/D converter 34 to the controller 44 based on the data system clock signal from the data system clock generator 35 and the data system timing signal from the data system timing generator 36, outputting an acknowledgment signal. When data is recorded, the reading/writing circuit 38 responds to a request signal from the controller 44 to supply data from the controller 44 through the output terminal 2o1 and the input terminal 1i1, as shown in FIG. 1, to the driver 18.

The servo system clock generator 39 generates a servo system clock signal from the output data from the A/D converter 34, and supplies the generated servo system clock signal to the servo system timing generator 40, the clock selector 41, and an address decoder 42. The servo system timing generator 40 generates a servo system timing signal based on the servo system clock signal supplied from the servo system clock generator 39, supplies the generated servo system timing signal to the clock selector 41, the address decoder 42, and the selector/clamp circuit 33. It also supplies the generated servo system timing signal through the output terminal 2o3 and the input terminal 1i3 (FIG. 1) to the driver 14 for the laser diode 13.

The drive controller 2 further includes a multiplexer (MUX) 45 for supplying a front automatic power control (APC) signal, a focus error signal, and a pull-in signal supplied through the respective input terminals 2i3, 2i4 and 2i5 from the I-V/matrix amplifier 16 to an A/D converter 46. An input/output circuit 47 supplies output data from the A/D converter 46 through the bus 43 to the digital signal processor 53. A pulse-width-modulation (PWM) circuit 48 serves to modulate data for actuating the optical block 8 which has been supplied from the digital signal processor 53 through the bus 43.

The drive controller 2 also has drivers 49, 50 and 51 for energizing the focus actuator 12 (FIG. 1), the galvanometer 11 (FIG. 1), and the slide motor 11 (FIG. 1), respectively, based on the modulated data from the PWM circuit 48. The driver 49 is connected to the focus actuator 12 through the output terminal 2o4 and the input terminal 1i4 shown in FIG. 1. The driver 50 is connected to the galvanometer motor 10 through the output terminal 2o5 and the input terminal 1i5 shown in FIG. 1. The driver 51 is connected to the slide motor 10 through the output terminal 2o6 and the input terminal 1i6 shown in FIG. 1.

An input/output circuit 52 supplies a drive signal supplied from the digital signal processor 53 to the spindle motor 6 (FIG. 1) through input/output terminals 1io7 and 2io7 and the driver 7 (FIG. 1). The digital signal processor 53 serves to control and energize the various blocks described above through the bus 43, and is connected to the controller 44 through a bus indicated by the thick solid line shown in FIG. 2.

In response to a request from the host computer 3, when the optical disk 4 is mounted on the spindle motor 6 by the loading mechanism 5, or when the optical disk 4 is loaded by the loading mechanism 5 in an automatic spin-up mode, the digital signal processor 53 issues a command through the input/output circuit 52 to the driver 7 to energize the spindle motor 6.

When the rotational speed of the spindle motor 6 reaches a predetermined rotational speed, the driver 7 outputs a lock signal to indicate to the digital signal processor 53 that the rotational speed of the spindle motor 6 is stabilized. During this time, the digital signal processor 53 causes the PWM circuit 48 to control the driver 50 to position the laser beam from the laser diode 13 outside of a user area of the optical disk 4, and also causes the PWM circuit 48 to control the driver 51 to move the optical block 8 radially inward or outward of the optical disk 4.

If the laser beam were focused in the user area, data on the optical disk 4 which is highly sensitive could possibly be erased in error. Since the optical block 8 is moved out of the user area and the laser beam is focused outside of the user area, such erroneous data erasure is prevented.

When the spindle motor 6 rotates at a constant speed and the optical block 8 is moved radially outward on the optical disk 4, the digital signal processor 53 supplies a bias current for the laser diode 13 through the input/output circuit 31 and the D/A converter 32 to the driver 14, and outputs a command to the servo system timing generator 40 to turn on the laser diode 13 to emit a laser beam.

The laser beam emitted from the laser diode 13 is applied to the photodetector 15 in the optical block 8, and the photodetector 15 converts the laser beam into a corresponding electrical signal. The electrical signal from the photodetector 15 is supplied as a detected output signal to the I-V/matrix amplifier 16, which converts the detected output signal into a voltage signal that is then supplied as a front APC signal to the MUX 45.

The front APC signal applied to the MUX 45 is time-division-multiplexed thereby, and then converted by the A/D converter 46 into a digital signal, which is supplied through the input/output circuit 47 and the bus 43 to the digital signal processor 53. The digital signal processor 53 recognizes the intensity of the laser beam emitted from the laser diode 13 based on the digital front APC signal, and sends back intensity control data calculated by a digital filter (not shown) through the input/output circuit 31 and the D/A converter 32 to the driver 14 to enable the driver 14 to control the laser diode 13 to produce a constant laser beam power.

Then, the digital signal processor 53 controls the PWM circuit 48 to supply a current to the driver 49 in order to energize the focus actuator 12 in a vertical direction to bring the focus actuator 12 into a focus search mode. At this time, the laser beam reflected by the optical disk 4 is applied to a light-detecting surface of the photodetector 15. The laser beam detected by the photodetector 15 is converted into an electrical signal, which is supplied as a detected output signal to the I-V/matrix amplifier 16. The I-V/matrix amplifier 16 converts the supplied signal into a voltage signal and amplifies that signal. The amplified voltage signal is then supplied from the I-V/matrix amplifier 16 as a focus error signal to the multiplexer 45.

The focus error signal is time-division-multiplexed together with the front APC signal by the MUX 45, and then converted by the A/D converter 46 into a digital signal. The digital focus error signal is supplied through the input/output circuit 47 and the bus 43 to the digital signal processor 53. The digital signal processor 53 digitally filters the digital focus error signal thereby to produce focus control data and feed the focus control data from the PWM circuit 48 back to the driver 49, thereby providing a focus control servo loop. When the focused condition of the laser beam is stabilized in the focus search mode, an RF signal outputted from the photodetector 15 and produced through the I-V/matrix amplifier 16 has an amplitude which is substantially constant. After the RF signal has been clamped to a certain potential by the selector/clamp circuit 33, the RF signal is converted into a digital signal by the A/D converter 34.

At this time, a clock signal has the free-running frequency of the servo system clock generator 39. Timing pulses for clamping signals with the selector/clamp circuit 33 are produced by frequency-dividing the free-running frequency of the servo system clock generator 39.

The servo system clock generator 39 checks for a pattern of pits formed on the optical disk 4 by determining an amplitude difference of the digital RF signal produced by the A/D converter 34, and then searching for a pattern which is the same as a pit train in a servo area. When the pattern is found, the servo system clock generator 39 controls the clock selector 41 to open a window in a position where a next pattern is to appear, and confirms whether the patterns in the window agree with each other.

If the above operation is confirmed successively in a certain number of times, then it is determined that the servo system clock generator 39 is locked to the pattern of pits on the optical disk 4. Phase information is produced by determining the difference between the amplitudes at both sides of wobble pits in the servo area. By adding phase information produced from both of two wobble pits, a gain variation caused by a change in amplitude depending on the tracking position is absorbed.

When the servo system clock generator 39 is locked, the positions of segment units are made clear and the positions of segment mark pits on the optical disk 4 can be recognized. RF signals are sampled at a plurality of positions Ar1, Ar2, Ar3, Ar4 with respect to segment mark pits, address mark pits, sector flag 1 pits, and sector flag 2 pits, and one of the positions where the amplitude of the sampled RF signal is at a maximum is searched for.

If the position of maximum is Ar1, then it represents an address mark, and its segment is an address segment, making it possible to recognize the starting end of a frame. Therefore, frames can be synchronized by clearing a frame counter. If one frame is composed of 14 segments, then the clock selector 41 is controlled to open a window in every 14 segments, and frame synchronization is judged as being locked when the segments can be successively recognized as an address mark.

When frames are synchronized, the positions where addresses are recorded on the optical disk 4 can be recognized. Consequently, track addresses and frame codes are decoded by the address decoder 42. The address decoder 42 decodes track addresses and frame codes by checking agreement between patterns in the form of gray codes, each of 4 bits and a gray code table. Since the entire pattern, not just 4 bits, is converted into gray codes, simple agreement with the table is not checked, but comparison is made with the table inverted depending on whether the least significant bit (LSB) in highorder 4 bits is "1" or "0".

Rotational synchronization is said to be achieved when a frame code that is decoded first is loaded into the frame counter, a numerical value obtained by incrementing the frame counter for each frame is compared with an actually reproduced frame, and it is confirmed that numerical values agree successively with actually reproduced frames. Thereafter, numerical values produced by the frame counter are returned as frame codes to the digital signal processor 53 for preventing frame positions from being recognized in error even when certain defects are present.

The digital signal processor 53 calculates the speed of the optical block 8 while reading the track addresses in the form of gray codes, and causes the PWM circuit 48 to control the slide motor 10 of the optical block 8 through the driver 51 for thereby moving the optical block 8 to a desired track on the optical disk 4.

When the optical block 8 positionally reaches the desired track on the optical disk 4, the optical block 8 enters a tracking mode. A tracking error signal is produced by determining the difference between the amplitudes of RF signals from two wobble pits in the servo area. The digital signal processor 53 digitally filters the tracking error signal to produce tracking control data, and supplies the tracking control data to cause the PWM circuit 48 to control the driver 50 to energize the galvanometer motor 11 in the optical block 8 to control variations in low-frequency components and also to effect tracking control to position the spot of the laser beam emitted from the laser diode 13 at the center of the track on the optical disk 4.

While the optical block 8 is under this type of tracking control, the digital signal processor 53 detects the position of the start of a desired track. The segment at the start of each sector and a segment preceding the segment are associated with sector marks. The clock selector 41 is controlled to open a window in each of the above four positions Ar1, Ar2, Ar3 and Ar4. When the position with the maximum amplitude among RF signals sampled at the four positions Ar1, Ar2, Ar3 and Ar4 is the position Ar2, each sector mark represents the segment at the start of a sector. When the position with the maximum amplitude is the position Ar3, each sector mark represents the segment that precedes the start of a sector. Basically, the segment at the start of a sector is determined by converting a sector address given by the host computer 3 into a physical sector and calculating to which segment of which track the sector belongs to. The probability that the sector marks of the above two types will simultaneously be defective is very small, and hence the probability that defective sectors will be produced thereby is also very small.

The data system clock generator 35 generates a data clock signal by multiplying, by M/N, a frame-synchronized servo clock signal produced from the servo system clock generator 39, and imparts the generated data clock signal to the data system timing generator 36 and the reading/writing circuit 38.

In a recording mode, the reading/writing circuit 38 is supplied with data to be recorded from the host computer 3 through the controller 44. The reading/writing circuit 38 then adds random numbers over 127 periods, for example, to the supplied data by exclusive-ORing them, thereby scrambling the data in each sector according to $Y=X^7+X+1$, and modulates the scrambled data into zero inverted (NRZI) data in synchronism with a data clock signal. At this time, the reading/writing circuit 38 sets an initial value of "0" for each segment, and supplies the modulated signal through the driver 18 to the magnetic head 17.

The magnetic head 17 generates a magnetic field depending on the modulated signal, and applies the magnetic field to a data area of the optical disk 4 which has been heated to the Curie temperature by the laser beam emitted from the laser diode 13, for thereby recording the NRZI data on the optical disk 4.

In a reproducing mode, an MO signal or an RF signal produced by the I-V/matrix amplifier 16 based on a detected output signal from the photodetector 15 is clamped to a predetermined potential by the selector/clamp circuit 33, and thereafter converted by the A/D converter 34 into a digital signal that is supplied to the reading/writing circuit 38. The reading/writing circuit 38 digitally filters the digital reproduced signal from the A/D converter 34 according to a partial response, and reproduces NRZI data based on Viterbi decoding. After having converted the NRZI data into non-return to zero (NRZ) data in each segment, the reading/writing circuit 38 descrambles the NRZ data in each sector, converts the descrambled data into reproduced data, and transfers the reproduced data through the controller 44 to the host computer 3. The MO signal and the RF signal are produced by combining a number of output signals from the photodetectors 15 in different combinations.

Figure 3:
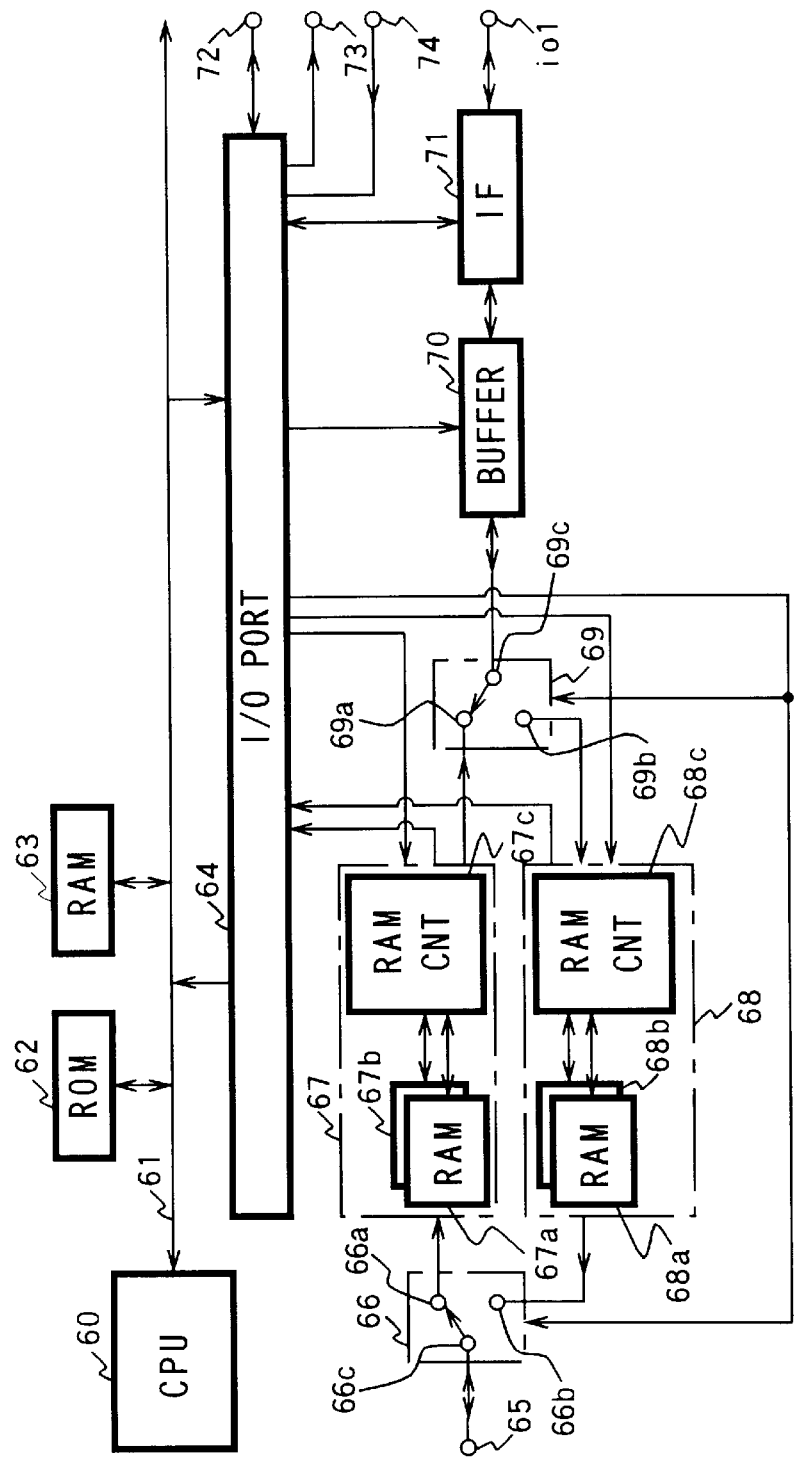
FIG. 3 is a block diagram of a controller in the optical disk rive shown in FIG. 1.

FIG. 3 shows, by way of example, an arrangement of the controller 44 shown in FIG. 2.

As shown in FIG. 3, the controller 44 has a central processing unit (CPU) 60, a bus 61 connected to the CPU 60 which is composed of an address bus, a data bus, and a control bus, a ROM 62 for storing various program data, parameter data, etc. for effecting various processes in the reproducing mode, a RAM 63 for use as a work storage area for storing program data, parameter data, etc. which are stored in the ROM 62, and an input/output port 64. The controller 44 also has a decoder 67 for effecting error correction and error checking on reproduced data, an encoder 68 for generating parity data with respect to data supplied from the host computer 3 and adding the generated parity data to the supplied data, a buffer 70, and an interface (IF) 71. The ROM 62, the RAM 63, the input/output port 64, the decoder 67, the encoder 68, the buffer 70, and the interface 71 are all connected to the bus 61.

The controller 44 also has an input/output terminal 65 connected to the reading/writing circuit 538 shown in FIG. 2 and a movable contact "c" of a switch 66. The switch 66 has a fixed contact "a" connected to an input terminal of the decoder 67, and another fixed contact "b" connected to an output terminal of the encoder 68.

The decoder 67 has a data output terminal connected to a fixed terminal "a" of a switch 69, and the encoder 68 has an input terminal connected to another fixed terminal "b" of the switch 69. The switch 69 has a movable contact "c" connected to an input/output terminal of the buffer 70 whose other input/output terminal is connected to an input/output terminal of the interface 71. The interface 71 has another input/output terminal connected through the input/output terminal iol to the input/output terminal of the host computer 3 shown in FIG. 1.

The decoder 67 effects error detection on reproduced data supplied through the switch 66 using a first ECC, effects error checking using the CRC when the number of detected errors reaches a number of errors that cannot be corrected, and effects error detection using a second ECC when errors are detected.

The decoder 67 comprises RAMs 67a and 67b and a RAM controller 67c for controlling reproduced data stored in the RAMs 67a and 67b to effect error correction using the LDC, error checking using the CRC, and error detection using the second ECC upon occurrence of a burst of errors for which the error correction and the error checking are ineffective. Each of the RAMs 67a and 67b has a storage capacity for storing one sector (composed of 2352 bytes in this embodiment) of reproduced data, and various data generated in an error detecting process and an error checking process described later on.

The decoder 67 supplies output data through the switch 69 to the buffer 70. The second ECC is parity data which is recorded in a given area of a sector next to the sector being recorded among ECC parity data generated by the data in the sector being recorded. The second ECC is also parity data which is used upon decoding to detect the position of an error in data in a sector when error correction on the data is impossible to carry out using parity data as the first ECC or an error is detected as occurring upon error checking using the CRC.

As shown in FIG. 3, the encoder 68 comprises RAMs 68a and 68b each having a storage capacity for storing one sector, and a RAM controller 68c for controlling input data stored in the RAMs 68a and 68b to generate parity data as the first ECC, the CRC, and the second ECC, and then to add this parity data. However, the encoder 68 adds only the parity data generated as the second ECC, with respect to the user data in a certain area, to the user data in a next area.

The encoder 68 adds these parity data to the data transferred from the host computer 3 and also adds the parity data as the second ECC in the preceding sector to the data.

The parity data for error checking and the parity data for error correction can be recorded on a writable area of a magneto-optical disk, a write-once disk, or a partial disk by the optical disk drive shown in FIG. 1. These parity data are recorded in a read-only area on a read-only optical disk or a partial disk when the disk is manufactured.

An input/output terminal 72 connected to the input/output port 64 is connected to the bus 43 of the digital signal processor 53 shown in FIG. 2. An input/output terminal 73 connected to the input/output port 64 is connected to an acknowledgment signal input terminal of the reading/writing circuit 38 shown in FIG. 2. An input/output terminal 74 connected to the input/output port 64 is connected to a request input signal of the reading/writing circuit 38 shown in FIG. 2.

A process of recording data transferred from the host computer 3 on the optical disk 4 will be described below.

The CPU 60 supplies a switching control signal through the input/output port 64 to the switches 66 and 69 to connect the moveable contacts "c" of the switches 66 and 69 to the fixed contacts "b" thereof. Data to be recorded which is transferred from the host computer 3 is read from the buffer 70, and thereafter supplied through the switch 69 to the encoder 68 which adds error-detecting and error-correcting codes to the data. Thereafter, the data is supplied through the switch 66 and the input/output terminal 65 to the reading/writing circuit 38 shown in FIG. 2, by which the data is recorded in the user area of the optical disk 4.

At this time, the encoder 68 adds parity data to the data of a certain sector (Nth sector) stored in the RAM 68a. When data processing for recording is finished, the encoder 68 supplies the data of the Nth sector with the parity data added thereto through the switch 63 to the input/output terminal 65, and supplies a signal indicative of the outputting of the data to the CPU 60 through the input/output port 64 and the bus 61. The CPU 60 now instructs the reading/writing circuit 38 shown in FIG. 2 to record the data, and controls the buffer 70 and the interface 71 to receive the next input data. In this manner, all data of the Nth sector is supplied to the drive 1 and recorded on the optical disk 4, during which time next input data is stored as data of a next sector ((N+1)th sector) in the RAM 68b.

To reproduce data recorded on the optical disk 4, the CPU 60 supplies a switching control signal through the input/output port 64 to the switches 66 and 69 to connect the moveable contacts "c" to the fixed contacts "a". Reproduced data read from the optical disk 4 and supplied through the reading/writing circuit 38, the input/output terminal 65, and the switch 66 is supplied to the decoder 67. The decoder 67 detects and corrects errors in the reproduced data, and supplies the reproduced data through the switch 69, the buffer 70, the interface 71, and the input/output terminal iol to the host computer 3 shown in FIG. 1.

At this time, when the decoder 67 corrects errors with parity data as the first ECC, checks errors with CRC parity data, or fails to correct errors because of a burst of errors in the data of the Nth sector stored in the RAM 67a, the decoder 67 reads parity data as second ECC from the data of the (N+1)th sector stored in the RAM 67b, and detects the position of errors using the parity data as the second ECC.

After having recognized the position of errors, the decoder 67 corrects the errors with the parity data as the first ECC to correct the data of the Nth sector, and then checks errors with the CRC parity data.

When the above reproducing process is finished, the decoder 67 outputs the data of the Nth sector, and supplies a signal indicative of the finishing of the reproducing process to the CPU 60 through the input/output port 64 and the bus 61. The CPU 60 now instructs the reading/writing circuit 38 shown in FIG. 2 to reproduce data of a next sector. In this manner, all data from the sector is supplied to the buffer 70, after which reproduced data of an (N+2)th sector read from the optical disk 4 is supplied to the RAM 67a.

The optical disk drive shown in FIGS. 1 through 3 may comprise a read-only optical disk, a disk having only a read-only area such as a partial disk or the like, a disk having a writable area in addition to a read-only area, a disk having only a read-only area such as a magneto-optical disk, a write-once disk, or the like, or a disk having a readable area in addition to a write-only area.

Figure 4:
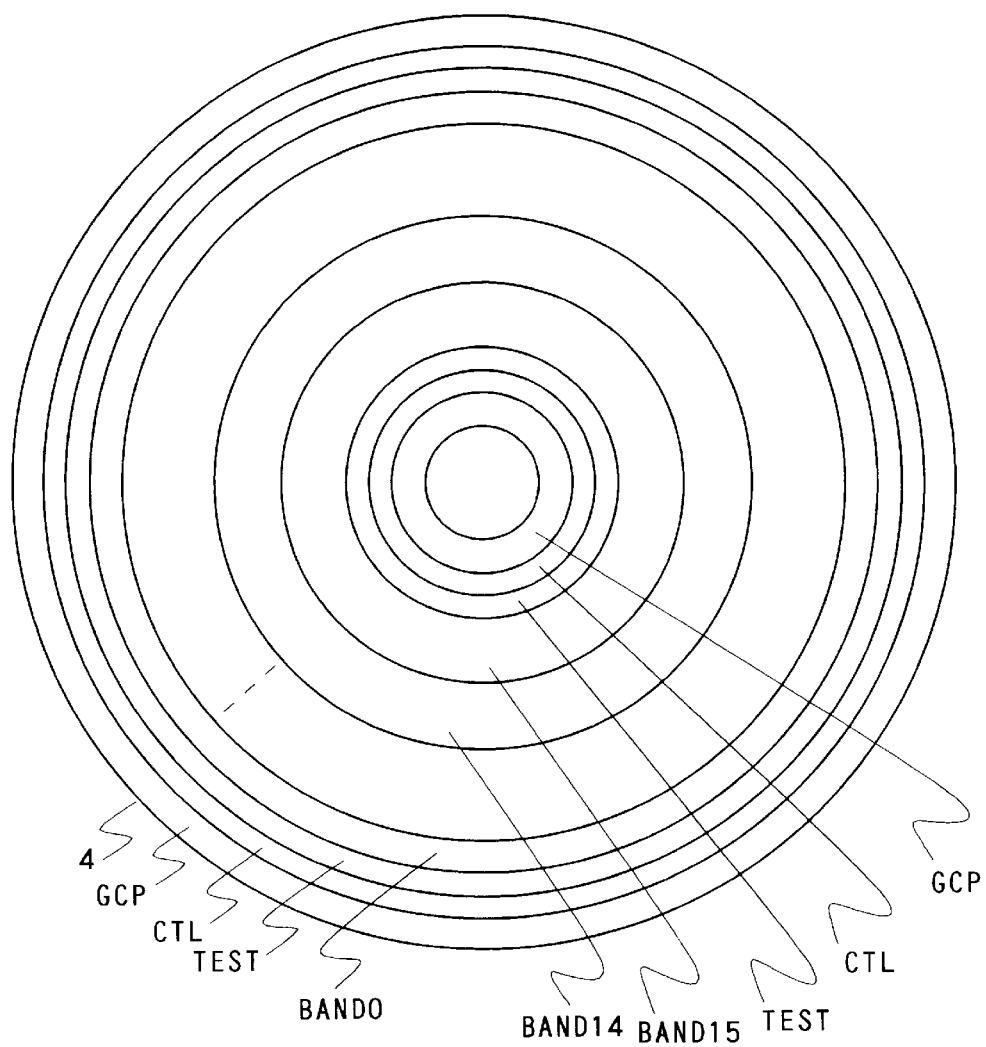
FIG. 4 is a view showing a format of an optical disk according to the present invention.

FIG. 4 shows, by way of example, a format of the optical disk 4.

As shown in FIG. 4, the optical disk 4 has a gray code part (GCP) area in which disk type data, etc. are recorded, a control (CTL) area, a TEST area, a BAND 0, BAND 1, . . . , BAND 15, a TEST area, a CTL area, and a GCP area which are arranged successively radially inward from the outermost circumferential zone to the innermost circumferential zone. The GCP area is an area in which additional information and address information are recorded, and in which pit patterns are represented by gray codes. The information recorded in the GCP area can be read even in a seek mode. The CTL area is an area in which information indicative of the medium type is recorded, and the TEST area is an area for writing data therein on a trial basis.

FIG. 5 shows, by way of example, a specific format of the optical disk 4 shown in FIG. 4. In FIG. 5, the GCP area in the uppermost row corresponds to the GCP area on the outermost circumferential zone of the optical disk 4 shown in FIG. 4, and the bands and areas arranged successively from the uppermost row to the lowermost row correspond respectively to the areas arranged successively radially inward from the outermost circumferential zone to the innermost circumferential zone on the optical disk 4 shown in FIG. 4.

In this example, the optical disk 4 is a zone constant angular velocity (CAV) disk. Therefore, as shown in FIG. 5, the data clock frequency varies from zone to zone.

FIGS. 6A, 6B, and 6C show, by way of example, a sector format of the optical disk 4. The contents of one sector are illustrated in FIGS. 6A, 6B, and 6C.

In FIGS. 6A, 6B, and 6C, "i" denotes a code word ("line" in FIGS. 6A, 6B, and 6C), and "j" denotes a byte. The solid-line arrow represents the direction in which data are written. Data indicated by D0–D2047 represent user data, data indicated by (P1, P2)~(P35, P36) represent parity data with respect to the user data D0~D127, . . . D1920~D2047 indicated respectively by i=130~123, . . . i=10~3. Data indicated by (Q1, Q2) represent parity data with respect to the parity data P1~P36, data indicated by (Q3, Q4) represent parity data with respect to the parity data P1~P36 and the parity data (Q1, Q2), and data indicated by CRC1~CRC8 represent error-checking parity data with respect to the user data D0~D2047.

Data indicated by (E1, 1)~(E16, 16) represent parity data of the Reed-Solomon code with respect to the user data D0~D2047 indicated respectively by j=0~j=15, the parity data P1~P36, and the parity data CRC1~CRC8. Specifically, the parity data j=0 composed of the parity data (E1, 1)~(E1, 16) are parity data with respect to the data D0, D16, . . . D2032, and the data indicated by j=0, i=130~0, and the data indicated by j=1, i=–1~–16 composed of the parity data (E2, 1)~(E2, 16) are parity data with respect to the data indicated by j=1, i=130~0. Similar parity data are given to the other lines.

As described above with reference to FIGS. 6A, 6B and 6C, if Reed-Solomon codes are constructed with respect to the data of the lines indicated by i=147~–16, each of the distances is 17. Therefore, as can be seen from Table 1 above, up to 8 successive errors can be detected and corrected, but 9 or more successive errors cannot be corrected.

In this example, the parity data P1~P36 as the second ECC for error checking and correction with respect to the data indicated by i=130, j=0~i=3, j=15, i=0, j=15~i=–16, j=15 are generated and used when data is reproduced.

Since the parity data (E1, 1)~(E16, 16) each has a vertical length of 147 bytes, the data length in the vertical direction of the user data D0~D2047 to which the parity data is added is 131 bytes, and the data length in the vertical direction of the parity data is 16 bytes, the distance is 17, and hence they make up a (147, 131, 17) Reed-Solomon code. One code word is one byte. As described above, one sector is of 16 bytes×147=2352 bytes.

The pattern of 7 lines—8 lines—7 lines with respect to the data of the sector shown in FIGS. 6A, 6B and 6C will be described with reference to FIG. 7.

As can be seen from FIG. 7. parity data P1 and P2 are generated with respect to all the data composed of 7 lines ranging from i=130 to 124 shown in FIGS. 6A, 6B and 6C. Parity data P3 and P4 are generated with respect to all the data composed of 8 lines ranging from i=123 to 116 shown in FIGS. 6A, 6B and 6C, and parity data P5 and P6 are generated with respect to all the data composed of 7 lines ranging from i=115 to 109 shown in FIGS. 6A, 6B, and 6C. Similarly, parity data are generated successively in the order of 7 lines, 8 lines and 7 lines.

Upon generation of the parity data P1~P40, three sets of Reed-Solomon codes composed of (114, 112, 3), (130, 128, 3), and (114, 112, 3) are successively produced.

According to this example, as described above, when data is recorded on the optical disk 4, parity data as the first ECC for error-correcting the data, parity data as the CRC for checking the data, and the parity data as the second ECC are generated in the pattern of 7 lines—8 lines—7 lines. If the optical disk 4 comprises a read-only disk, only the parity data as the second ECC are recorded in a particular area in an (N+1)th sector following an Nth sector on the optical disk 4.

There is a possibility for uncorrectable data to be produced depending on the manner in which a burst of errors occurs upon reproduction of data. The reasons for such a possibility, and a procedure of coping with such a burst of errors will be described below.

Figure 8:
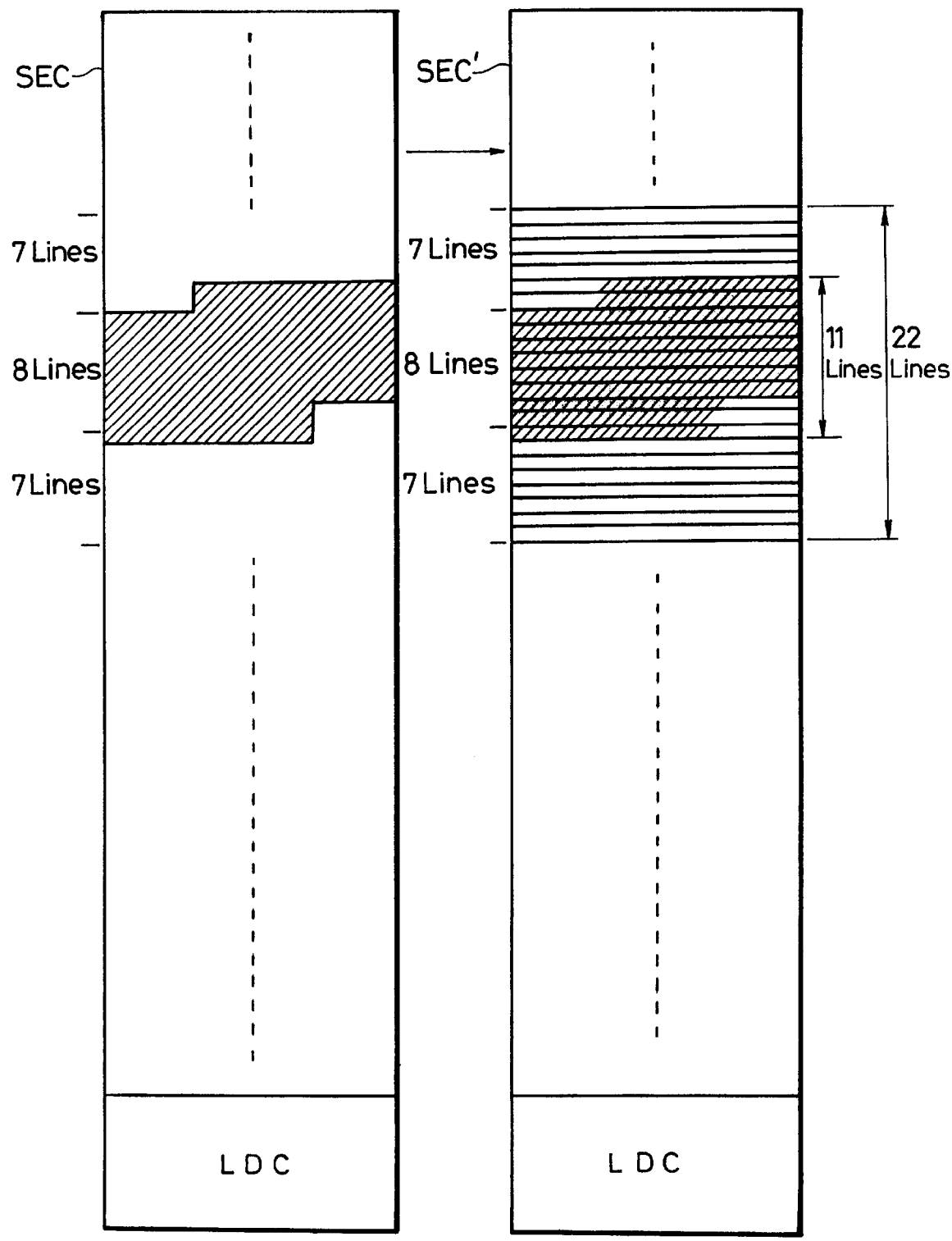
FIG. 8 is a diagram showing how to process a burst of errors which occurs in a sector.

FIG. 8 shows how to process a burst of successive errors which occurs in a certain sector.

In FIG. 8, the reference characters SEC represent a sector, and the reference characters SEC' represent details of the sector. The sector SEC, SEC' is based on the use of the pattern of 7 lines—8 lines—7 lines which has been described above with reference to FIG. 7. Groups of data composed of 7 lines and 8 lines will hereinafter be referred to as blocks.

It is assumed that all the data contained in an area, shown hatched, in the sector SEC shown in FIG. 8 suffers a burst of errors. When such a burst of errors occurs in the sector SEC, it cannot be detected using the parity data LDC as the first ECC because the parity data LDC as the first ECC can only detect up to errors of 8 bytes since its distance d is "17". However, errors in a certain block can be detected using the parity data P1~P40 as the second ECC, and can be erasure-corrected by regarding the block containing the errors as being erased. For the pattern of 7 lines—8 lines—7 lines, the data that can be erasure-corrected is a maximum of 15 lines when the burst of errors extends exactly over the 7 lines and the 8 lines. For a pattern composed of only 8 lines, the data that can be erasure-corrected is composed of 15 lines.

If the burst of errors which extends over the 7-line block, the 8-line block, and the 7-line block, is composed of 11 lines, then it is necessary to erasure-correct the data of 22 lines (=7+8+7 lines). In this case, the data cannot be erasure-corrected even with the parity data P1~P40 as the second ECC.

According to the present invention, it is possible to correct such a burst of errors that extends over 3 successive blocks, e.g., the 7-line block, the 8-line block, and the 7-line block. In the above example, specifically, the errors are detected using the parity data P1~P40 as the second ECC, and thereafter, 8 lines are erasure-corrected using the parity data LDC as the first ECC by regarding the central 8 lines of data as being erased, and the errors are detected and corrected with the remaining 4 bytes. Alternatively, the errors are detected using the parity data P1~P40 as the second ECC, and thereafter, (8+L) lines are erasure-corrected using the parity data LDC as the first ECC by regarding the central 8 lines of data and the N lines of data, above and below the central 8 lines of data, as being erased. The errors are then detected and corrected with the remaining M bytes. The patterns of the above error correction are given below.

| | |
|---|---|
| 8-line erasure correction and 4-line detection correction | 12 lines, |
| 10 (8 + 1 line, above and below)-line erasure correction and 3-line detection correction | 13 lines, |
| 12 (8 + 2 lines, above and below)-line erasure correction and 2-line detection correction | 14 lines, |
| 14 (8 + 3 lines, above and below)-line erasure correction and 1-line detection correction and | 15 lines, |
| 16 (8 + 4 lines, above and below)-line erasure correction | 16 lines. |

If the central block is composed of 7 lines, the patterns of the error correction are as follows:

| | |
|---|---|
| 7-line erasure correction and 4-line detection correcton | 11 lines, |
| 9 (7 + 1 line, above and below)-line erasure correction and 3-line detection correction | 12 lines, |
| 11 (7 + 2 lines, above and below)-line erasure correction and 2-line detection correction | 13 lines, |
| 13 (7 + 3 lines, above and below)-line erasure correction and 1-line detection correction | 14 lines, and |
| 15 (7 + 4 lines, above and below)-line erasure correction | 15 lines. |

Any one of the above patterns is based on the assumption that the distance d is "17" and the data that can be corrected do not exceed "17" lines.

Figure 9:
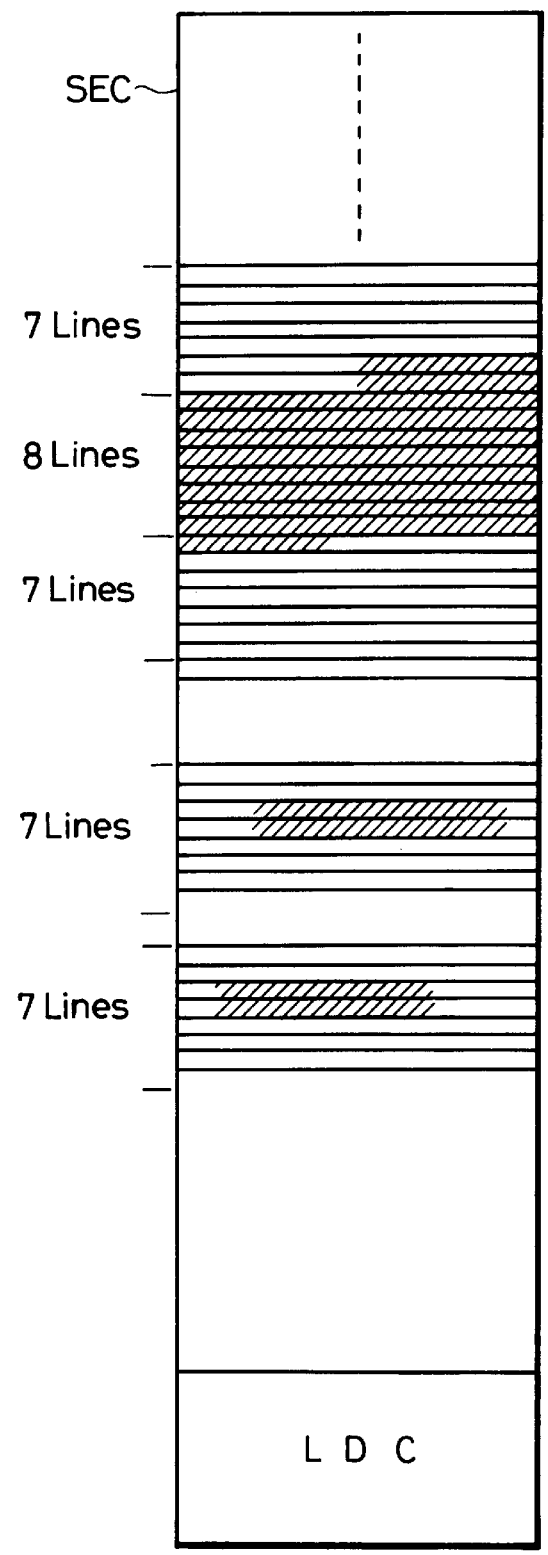
FIG. 9 is a diagram showing how to process a plurality of bursts of errors which occur in a sector.

FIG. 9 shows how to process a plurality of bursts of errors which occur in a sector.

In FIG. 9, the reference characters SEC represent details of a sector. The sector SEC is based on the use of the pattern of 7 lines—8 lines—7 lines which has been described above with reference to FIG. 7.

In the example shown in FIG. 9, a burst of errors in excess of 8 lines occurs in a position which contains a block of 8 lines, and bursts of errors occur in two respective positions, each in a block of 7 lines, both spaced from the position in which the burst of errors in excess of 8 lines occurs. Therefore, three bursts of errors occur in spaced positions, respectively.

When three bursts of errors occur in spaced positions, respectively, the errors are detected using the parity data P1~P40 as the second ECC, and if the number of error flags obtained as a result of the error detection is "3" and the error flags are detected as being successive, then it is assumed that three bursts of errors occur in spaced positions, respectively, and the data of any one of the blocks is regarded as being erased and hence erasure-corrected, and the errors in the data in the other blocks are detected and corrected.

In this example, the data in the block of 8 lines suffering the burst of errors is regarded as being erased, and subjected to 8-line erasure correction, and the data in the two blocks each of 7 lines suffering the other bursts of errors is subjected to 4-line detection correction.

The blocks which contain bursts of errors may not comprise 3 successive blocks, but may comprise 2 successive blocks and 1 independent block.

FIGS. 10 through 13 show a process of operation of the controller shown in FIG. 3, for processing data upon reproduction thereof by the optical disk drive shown in FIG. 1. The process of operation of the controller for processing data upon reproduction thereof will be described below with reference to FIGS. 10 through 12 as well as FIGS. 1 through 3. The flow chart shown in FIG. 10 contains subroutines SUB1~SUB3. These subroutines SUB1~SUB3 are included for illustrative purpose only, and will not be generated as subroutines in an actual program.

Step S1 determines whether or not there is a command, i.e., whether a command composed of a sector number, sector length data, etc. is supplied from the host computer 3 to the controller 2 through the input/output terminal io1, the interface 71, and the input/output port 64. If the determination is "YES", then control goes to a step S2.

Sectors in a requested range are successively read in step S2. Actually, however, one sector is read each time step S2 is executed. Specifically, the CPU 60 of the controller 44 supplies a request signal through the output terminal 73 to the reading/writing circuit 38. Data from a sector is successively read from the optical disk 4 until the sector length indicated by the host computer 3 is reached. The data read from the optical disk 4 is supplied through the reading/writing circuit 38 and the input terminal 65 to the switch 66. The CPU 66 supplies a switching control signal to the switches 66 and 69 to connect the movable contacts "c" to the fixed contacts "a" thereof. The reproduced data supplied from the switch 66 is supplied through the switch 66 to the decoder 67. Then, control proceeds to a step S3.

In the step S3, errors are detected and corrected using the LDC. Specifically, the CPU 60 instructs the decoder 67 to detect and correct errors using the parity data (E1, 1)~(E16, 16). The decoder 67 now detects and corrects errors in the data D0~D2047. Then, control proceeds to step S4.

Step S4 determines whether or not the error correction is "OK," i.e., whether or not errors have been corrected. If the determination is "YES", then control goes to step S5, and if it is "NO", control goes to step S7.

Step S5 determines whether or not CRC checking is "OK," i.e., whether or not an error is detected by CRC checking. If the determination is "YES", then control goes to step S6, and if the result is "NO", control goes to step S9.

Step S6 determines whether or not the processing indicated by the command has been finished, i.e., whether or not the reading of all the sectors in the range requested by the command inputted in the step S1 has been finished. If the determination is "YES", then the processing sequence comes to an end, and if it is "NO", then control goes back to step S2.

In step S7, errors are detected according to the second ECC, and flags are added. Specifically, the CPU 60 instructs the decoder 67 to detect errors using the parity data P1~P40. The decoder 67 now detects errors in the data D0~D2047 block by block, and generates error flags. Specifically, the decoder 67 effects error detection on each block. If there are errors in a block, then the decoder 67 regards the block as being erased, and adds a flag indicating that the block is erased. For example, the decoder 67 detects whether or not there are errors using the parity data P1 and P2 with respect to a block indicated by i=130~124. If there are errors in that block, then the decoder 67 adds a flag indicating that the block has suffered a burst of errors. The decoder 67 effects such processing on all the blocks. Then, control proceeds to a step S8.

Step S8 determines whether the number of error flags is 0 or $\geq 4$. If the determination is "YES", then control goes to step S9, and if it is "NO", then control jumps to step S11. In this example, since errors cannot be corrected if bursts of errors occur in four or more blocks in one sector, the step S8 determines whether the number of error flags is at least "4". An error is indicated when the number of error flags is "0" because when the number of error flags is "0", there is an error in a detecting process, either using the parity data P1~P40 as the second ECC or using the parity data (E1, 1)~(E16, 16).

An error message is displayed in step S9, and then control goes to step S10. Specifically, in step S9, the CPU 60 supplies message data stored in the ROM 62 to the host computer 3, which displays a message image on the display of the host computer 3. The message image may contain the following message:

"BECAUSE AN ERROR HAS OCCURRED, THE SECTOR IS BEING READ AGAIN."

In step S10, the re-reading of the sector is set. Thereafter, control goes back to the step S6. In the step S10, the CPU 60 supplies a request signal indicating the re-reading of the sector to the reading/writing circuit 38 through the output terminal 73. The data of the sector is read again from the optical disk 4.

Step S11 determines whether or not the number of error flags is "3". If the determination is "YES", then control proceeds to a step S12, and if it is "NO", then control goes to a step S100 which is a subroutine SUB2. The number "3" used as the criterion in the step S11 is the number of blocks which contain bursts of errors in one sector, and is equal to the maximum number of errors that can be corrected.

Step S12 determines whether or not there are 3 successive error flags, i.e., whether or not the blocks to which the 3 error flags are added are 3 successive blocks. If the determination is "YES", then control goes to a step S50 which is a subroutine SUB1, and if it is "NO", then control goes to a step S150 which is a subroutine SUB3. Whether the error flags are 3 successive error flags or not is determined in order to determine whether the blocks which contain bursts of errors are successive or separate for effecting subsequent processes optimum for both cases.

Figure 10:
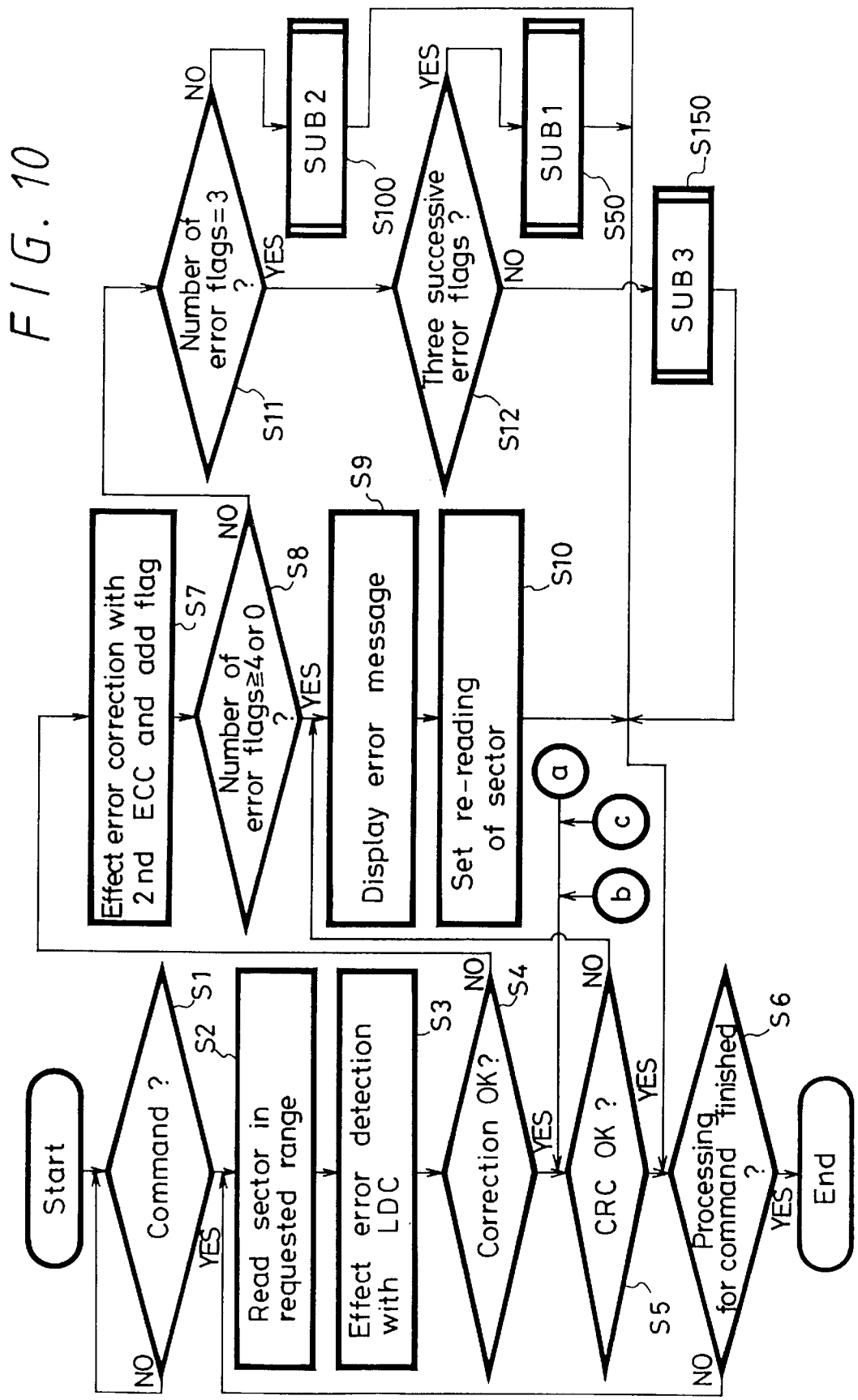
FIG. 10 is a flow chart of a process of operation of the controller shown in FIG. 3, for processing data upon reproduction thereof by the optical disk drive shown in FIG. 1.
Figure 11:
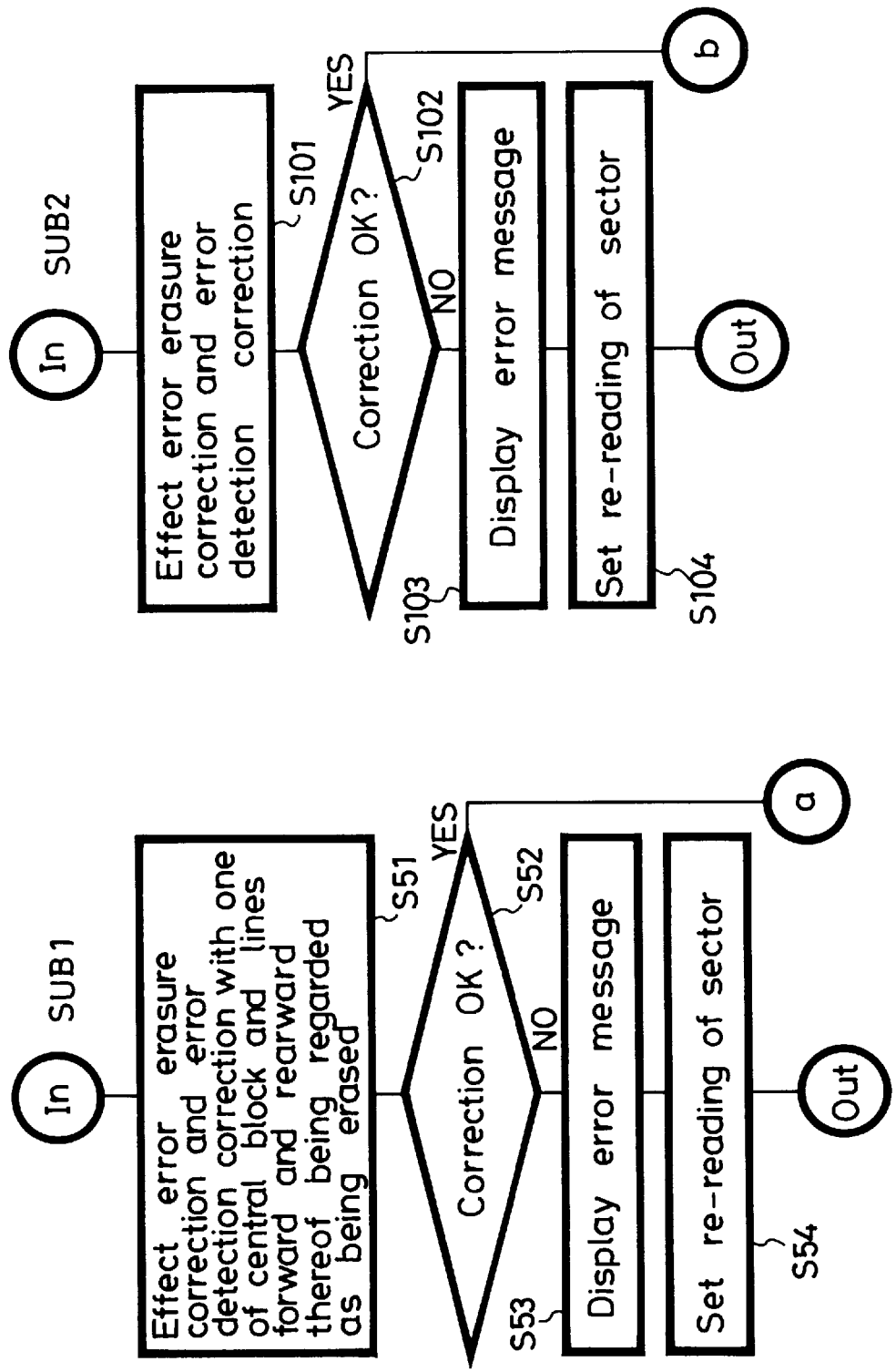
FIG. 11 is a flow chart of subroutines of the process shown in FIG 10.

FIG. 11 illustrates the subroutines SUB1, SUB2 shown in FIG. 10. Subroutine SUB1 will first be described below.

If the determination is "YES" in step S12 shown in FIG. 10, control jumps to step S51 of the subroutine SUB1. In step S51, the central block and one line closer to the central block, in each of the blocks before and after the central block, are regarded as being erased, errors are erasure-corrected with the LDC, i.e., the first ECC indicated by i=−13~−16, and errors are detected and corrected. Then, control proceeds to a step S52. In the step S51, the central block and 1 line above and below the central block are regarded as being erased, errors are erasure-corrected, and errors are detected and corrected using the remaining distance. If the central block is composed of 7 lines, then a total of 9 lines composed of the 7 lines and 1 line above and below the 7 lines are erasure-corrected for 9 bytes, and errors are detected and corrected using the remaining distance. In this case, up to 3 bytes can be detected and corrected. If the central block is composed of 8 lines, then a total of 10 lines composed of the 8 lines and 1 line above and below the 8 lines are erasure-corrected for 10 bytes, and errors up to 3 bytes are detected and corrected using the remaining distance.

Step S52 determines whether or not the error correction is "OK," i.e., whether or not errors have been corrected. If the determination is "YES", then control leaves the subroutine SUB1 and goes back to step S5 in the flowchart shown in FIG. 10, and if it is "NO", control goes to step S53.

An error message is displayed in step S53, and then control goes to step S54. Specifically, in step S53, the CPU 60 supplies message data stored in the ROM 62 to the host computer 3, which displays a message image on the display of the host computer 3. The message image may contain the following message:

"BECAUSE AN UNCORRECTABLE BURST OF ERRORS HAS OCCURRED, THE SECTOR IS BEING READ AGAIN."

In step S54, the re-reading of the sector is set. Thereafter, control goes back to step S6 in the flowchart shown in FIG. 10. In step S54, the CPU 60 supplies a request signal indicating the re-reading of the sector to the reading/writing circuit 38 through the output terminal 73. The data of the sector is read again from the optical disk 4.

Subroutine SUB2 will now be described below.

If the determination is "NO" in step S11 shown in FIG. 10, control jumps to step S101 of the subroutine SUB2. In step S101, errors are erasure-corrected with the LDC detected and corrected. Then, control proceeds to step S102. Step S101 is executed if the number of error flags is "2" or "1", i.e., either if a burst of errors occurs over two blocks, or if bursts of errors occur respectively in two separate blocks, or if a burst of errors occurs in one block. In step S101, therefore, the data of one block or two blocks are regarded as being erased, and errors are erasure-corrected. With the remaining distance, errors are checked if two blocks are erased, and errors are detected and corrected if one block is erased.

Step S102 determines whether or not the error correction is "OK," i.e., whether or not errors have been corrected. If the determination is "YES", then control leaves the subroutine SUB2 and goes back to step S5 in the flowchart shown in FIG. 10, and if it is "NO", control goes to step S103.

An error message is displayed in step S103, and then control goes to step S104. Specifically, in the step S103, the CPU 60 supplies message data stored in the ROM 62 to the host computer 3, which displays a message image on the display of the host computer 3. The message image may contain the following message:

"A CORRECTABLE BURST OF ERRORS HAS BEEN CORRECTED. HOWEVER, THE SECTOR IS BEING READ AGAIN BECAUSE OF AN ERROR IN ERROR CHECKING."

Step S104 sets the re-reading of the sector. Thereafter, control goes back to step S6 in the flowchart shown in FIG. 10. In the step S104, the CPU 60 supplies a request signal indicating the re-reading of the sector to the reading/writing circuit 38 through the output terminal 73. The data of the sector is read again from the optical disk 4.

Figure 12:
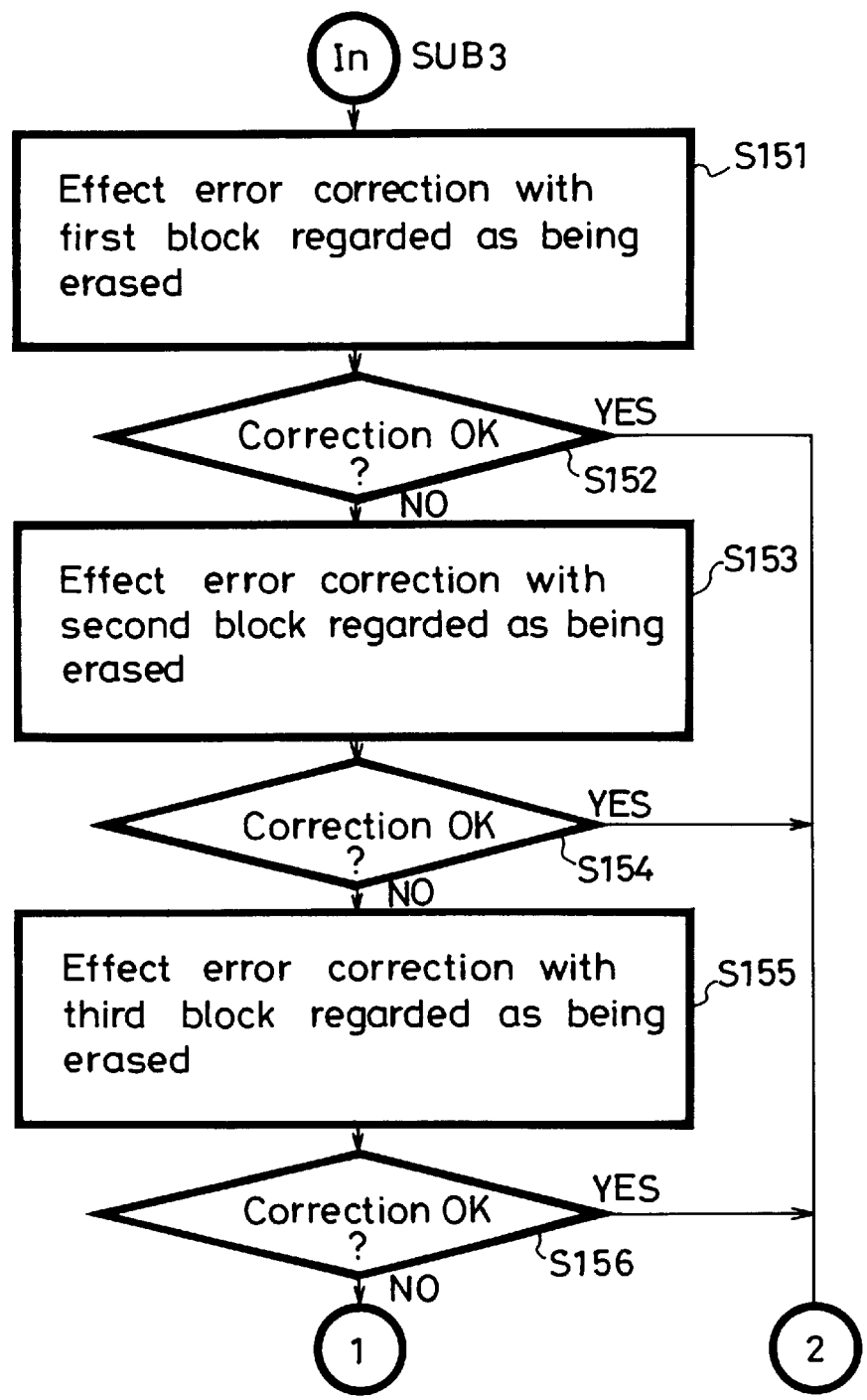
FIGS. 12 and 13 are flow charts of a subroutine of the process shown in FIG. 10.
Figure 13:
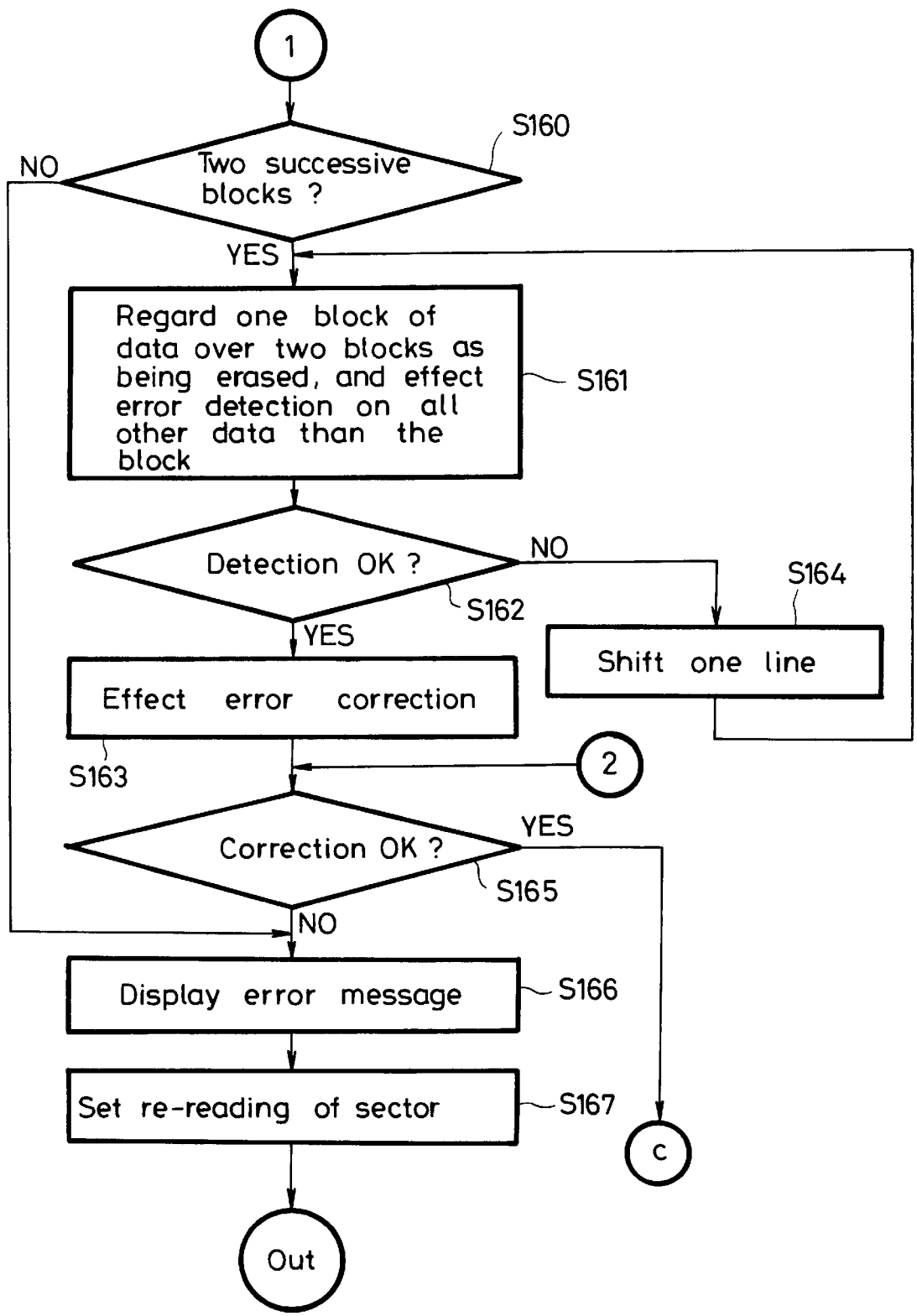

FIGS. 12 and 13 illustrate the subroutine SUB3 shown in FIG. 10.

If there are not 3 successive error flags in step S12 of the flowchart shown in FIG. 10, then control goes to step S151 of the subroutine SUB3 shown in FIG. 12. The flowchart illustrated in FIGS. 12 and 13 is based on the assumption that bursts of errors occur in three blocks, with at least one of the blocks being spaced from the other two blocks.

If 8 bytes are regarded as being erased, then errors up to 4 bytes can be detected and corrected with the remaining distance.

In step S151, the first block, i.e., the uppermost block in FIG. 11, is regarded as being erased, and errors are erasure-corrected, and errors are detected and corrected in the second and third blocks. In the second and third blocks, errors up to 4 bytes can be detected and corrected.

Step S152 determines whether or not the error correction is "OK." If the determination is "YES", then control goes to step S5 of the flowchart shown in FIG. 10, and if it is "NO", then control proceeds to step S153. In step S153, the second block, i.e., the middle block shown in FIG. 11, is regarded as being erased, and errors are erasure-corrected, and errors are detected and corrected in the first and third blocks. In the first and third blocks, errors up to 4 bytes can be detected and corrected.

Step S154 determines whether or not the error correction is "OK." If the determination is "YES", then control goes to step S5 of the flowchart shown in FIG. 10, and if it is "NO", then control proceeds to step S155. In step S155, the third block, i.e., the lowermost block shown in FIG. 11, is regarded as being erased, and errors are erasure-corrected, and errors are detected and corrected in the first and second blocks. In the first and second blocks, errors up to 4 bytes can be detected and corrected.

Step S156 determines whether or not the error correction is "OK." If the determination is "YES", then control goes to step S5 of the flowchart shown in FIG. 10, and if it is "NO", then control proceeds to step S160.

Step S160 determines whether or not there are 2 successive blocks, i.e., whether or not two of the three blocks are successive blocks. If the determination is "YES", then control goes to step S161, and if it is "NO", then control jumps to step S166.

In step S161, data which corresponds to one block and extends over two blocks is regarded as being erased, and errors in the remaining data are detected and corrected. Errors up to 4 bytes can be detected and corrected in the data in the two blocks which are not regarded as being erased. Thereafter, control goes to step S162.

Step S162 determines whether or not errors have been detected. If the determination is "YES", then control goes to step S163; if it is "NO", then control goes to step S164.

In step S163, the errors are corrected. Then, control proceeds to step S165.

In step S164, the position of the data which corresponds to one block and is regarded as being erased is shifted one line. Then, control goes back to step S161. In step S164, the position of the data is shifted one line because there is an instance where errors may be corrected by shifting the position of the block that is regarded as being erased.

Step S165 determines whether or not the error correction is "OK." If the determination is "YES", then control goes to step S5 of the flowchart shown in FIG. 10, and if it is "NO", then control proceeds to step S166.

An error message is displayed in step S166, and then control goes to step S167. Specifically, in the step S166, the CPU 60 supplies message data stored in the ROM 62 to the host computer 3, which displays a message image on the display of the host computer 3. The message image may contain the following message:

"A CORRECTABLE BURST OF ERRORS HAS BEEN CORRECTED. HOWEVER, THE SECTOR IS BEING READ AGAIN BECAUSE OF AN ERROR IN ERROR CORRECTION."

In step S167, the re-reading of the sector is set. Thereafter, control goes back to step S6 in the flowchart shown in FIG. 10. In step S167, the CPU 60 supplies a request signal indicating the re-reading of the sector to the reading/writing circuit 38 through the output terminal 73. The data of the sector is read again from the optical disk 4.

The re-reading of the sector may be carried out only in step S10, and if an error occurs in other steps, the re-reading of the sector may not be carried out, and the processing may be ended. For example, if no recovery from an error can be made when the sector is re-read in steps S54, S104 and S167, then since the optical disk drive may possibly have failed or a considerable burst of errors may possibly have occurred, the processing may suffer looping, resulting in a possibility of failure to remove the optical disk 4. Alternatively, if an error occurs even after the re-reading of the sector has been carried out three times, then the optical disk drive may supply the host computer 3 with a message which could read "OPTICAL DISK WILL BE DISCHARGED BECAUSE OF A POSSIBILITY OF AN UNCORRECTABLE BURST OF ERRORS OR FAILURE OF THE OPTICAL DISK DRIVE", and then discharge the optical disk 4.

Figure 14:
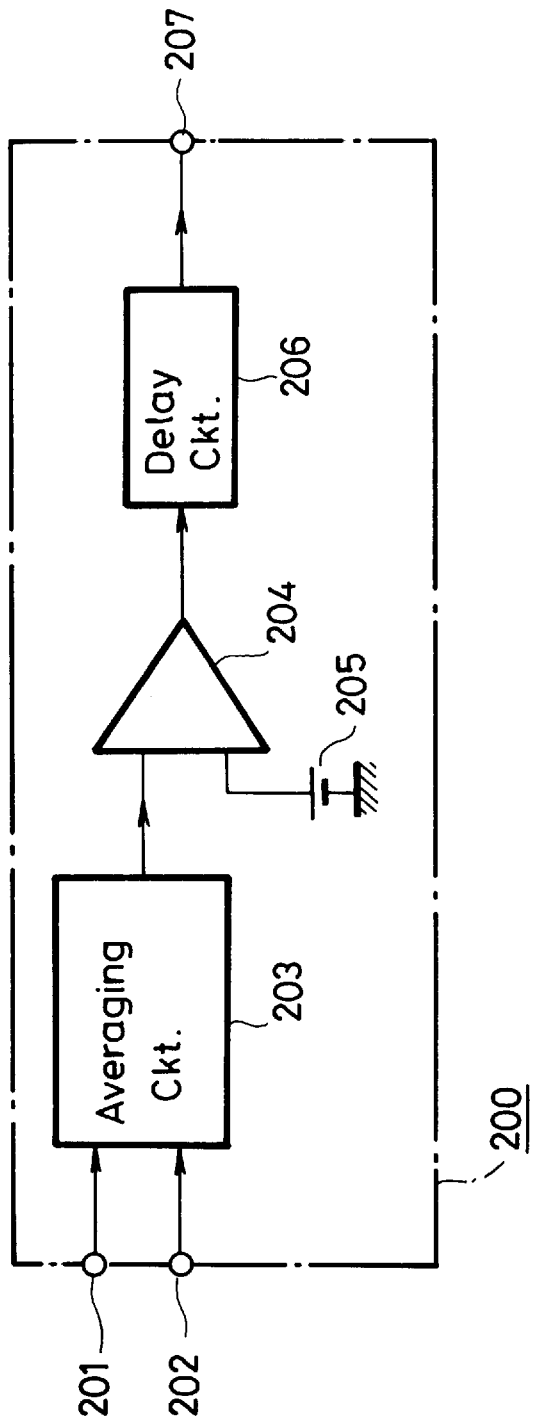
FIG. 14 is a block diagram of a level detector according to another embodiment of the present invention.

FIG. 14 shows a level detector according to another embodiment of the present invention, which is necessary to detect the length and position of a burst of errors by detecting an RF level instead of parity data as the second ECC used in the previous embodiment.

The drive controller shown in FIG. 2 may include a level detecting circuit 200 connected to the selector/clamp circuit 33, the data system clock generator 35, and the controller 44. The level detecting circuit 200 may have an internal structure as shown in FIG. 14.

In FIG. 14, the level detecting circuit 200 has an input terminal 201 for receiving an RF signal, before being clamped from the selector/clamp circuit 33, an input terminal 202 for receiving the data system clock signal from the data system clock generator 35, and an output terminal 207 connected to the controller 44. The level detecting circuit 200 also has an averaging circuit 203 for averaging the RF signal supplied through the input terminal 201 in timed relation to the data system clock signal supplied through the input terminal 202, producing a direct current (DC) voltage signal. The DC voltage signal generated by the averaging circuit 203 is supplied to a comparator 204, which compares the DC voltage signal with a reference voltage from a reference power supply 205 connected to the comparator 204. In a sample servo system, it is easy to obtain, in advance, a representative level upon a reduction of the RF level which is caused by a tracking error due to the dropout of wobble pits that are formed one byte per about 20 bytes of data. Therefore, the reference voltage from the reference power supply 205 should be of a level lower than the RF level, and free of tracking errors.

The comparator 204 outputs an error signal of "1" when the DC voltage signal from the averaging circuit 203 is smaller than the reference voltage from the reference power supply 205. The error signal is supplied to a delay circuit 206, which delays the error signal by a period of time corresponding to the processing time for main signals, and supplies the delayed signal to the controller 44 when errors are detected in the reproduced data.

Figure 15:
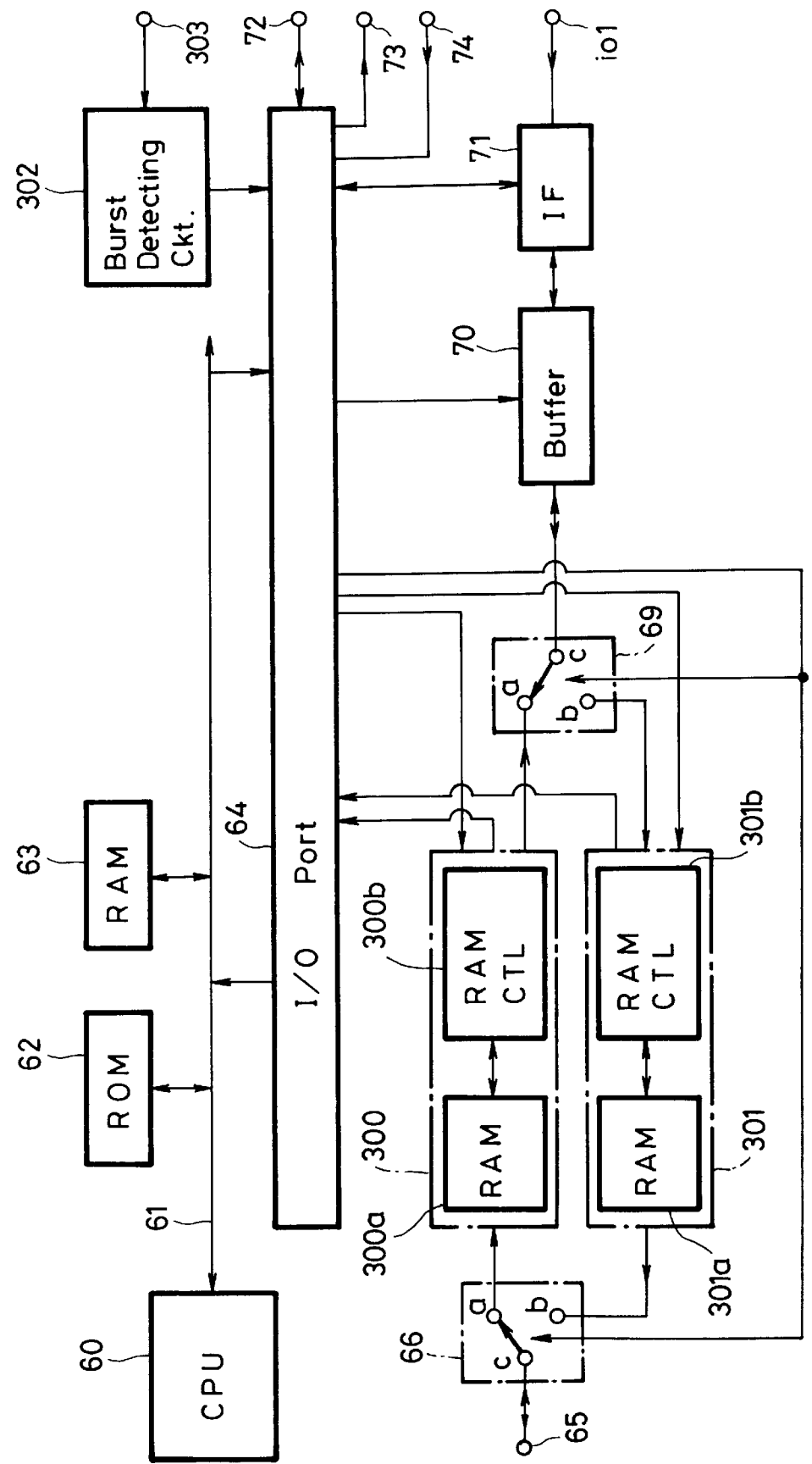
FIG. 15 is a block diagram of a controller according to still another embodiment of the present invention.

FIG. 15 shows a controller according to another embodiment of the present invention, for detecting the length and position of a burst of errors by detecting an RF level instead of parity data as the second ECC. The controller shown in FIG. 15 may be incorporated in a drive controller which differs from the drive controller shown in FIG. 2 except that the level detecting circuit 200 is included. The controller shown in FIG. 15 is similar to the controller shown in FIG. 3, and those parts shown in FIG. 15 which are identical to those shown in FIG. 3 will not be described in detail below.

As shown in FIG. 15, the controller has an input/output terminal 65 connected to the reading/writing circuit 38 shown in FIG. 2 and a moveable contact "c" of a switch 66. The switch 66 has a fixed contact "a" connected to an input terminal of a decoder 300, and another fixed contact "b" connected to an output terminal of an encoder 301.

The decoder 300 has a data output terminal connected to a fixed terminal "a" of a switch 69, and the encoder 301 has an input terminal connected to another fixed terminal "b"0 of the switch 69. The switch 69 has a moveable contact "c" connected to an input/output terminal of the buffer 70 whose other input/output terminal is connected to an input/output terminal of the interface 71. The interface 71 has another input/output terminal connected through the input/output terminal io1 to the input/output terminal of the host computer 3 shown in FIG. 1.

The decoder 300 effects error detection and error correction on reproduced data supplied through the switch 66, and effects error correction based on the result of that detection through a burst detecting circuit 302 if there is a request from the CPU 60 through the input/output port. The decoder 300 comprises a RAM 300a having a storage capacity of 2 sectors and a RAM controller 300b for controlling reproduced data stored in the RAM 300a to effect error correction using the LDC, error checking using the CRC, and error correction using the parity data of the LDC upon occurrence of a burst of errors for which the error correction and the error checking are ineffective, based on the result of detection by the burst detecting circuit 302.

The encoder 301 comprises a RAM 301a having a storage capacity of 2 sectors and a RAM controller 301b for controlling input data stored in the RAM 301a to generate parity data as the first ECC, parity data as the CRC, and add these parity data.

The encoder 301 adds the parity data for error detection, the parity data as the CRC for error correction, and parity data as the first ECC to data which has been transferred from the host computer 3, stored into the buffer 70 through the interface 71, read from the buffer 700, and supplied through the switch 69 for being recorded.

In the optical disk drive shown in FIG. 1, the parity data for error checking and the parity data for error correction can be written in writable areas on a magneto-optical disk, a write-once disk, and a partial disk, and hence both the encoder and the decoder are involved in recording the data on these disks. For reading data from a read-only area on a read-only optical disk or a partial disk, the encoder is not involved. Only the decoder is involved therein because the parity data and other data are recorded when the disk is manufactured.

The burst detecting circuit 302 detects the magnitude and position of a burst of errors when it occurs, based on the result of detection by the level detecting circuit 200 shown in FIG. 14, and supplies a signal indicative of the detected magnitude and position to the decoder 300 through the input/output port 64.

Major aspects of operation of the controller shown in FIG. 15 will be described below.

To reproduce recorded data from the optical disk 4, the CPU 60 supplies a switching control signal through the input/output port 64 to the switches 66, and 69 to connect the moveable contacts "c" of the switches 66 and 69 to the fixed contacts "a" thereof. Reproduced data is read from the optical disk 4 and supplied through the reading/writing circuit 38, the input/output terminal 65, and the switch 66 to the decoder 300. After errors have been detected and corrected in the reproduced data by the decoder 300, the reproduced data is supplied through the switch 69, the buffer 70, the interface 71, and the input/output port io1 to the host computer 3.

At this time, the decoder 300 effects error correction on the data of one of the two sectors stored in the RAM 67a, using the parity data as the first ECC, and effects error checking on the same data using the parity data as the CRC. If a burst of errors occurs, making it impossible to effect such error correction and error checking, then the decoder 300 recognizes the magnitude and position of the burst of errors based on the result of detection by the burst detecting circuit 302, and thereafter effects error correction on the data of the sector using the parity data as the first ECC, and effects error checking on the data of the sector using the parity data as the CRC. After the processing of the reproduced data is finished, the decoder 300 outputs the data of the sector, and supplies a signal indicating the outputting of the data through the input/output port 64 and the bus 61 to the CPU 60. The CPU 60 then instructs the reading/writing circuit 38 shown in FIG. 2 to reproduce a next sector. All the data of the above sector is supplied to the buffer 70, after which reproduced data from the next sector read from the optical disk 4 is supplied to the RAM 300a.

Figure 16:
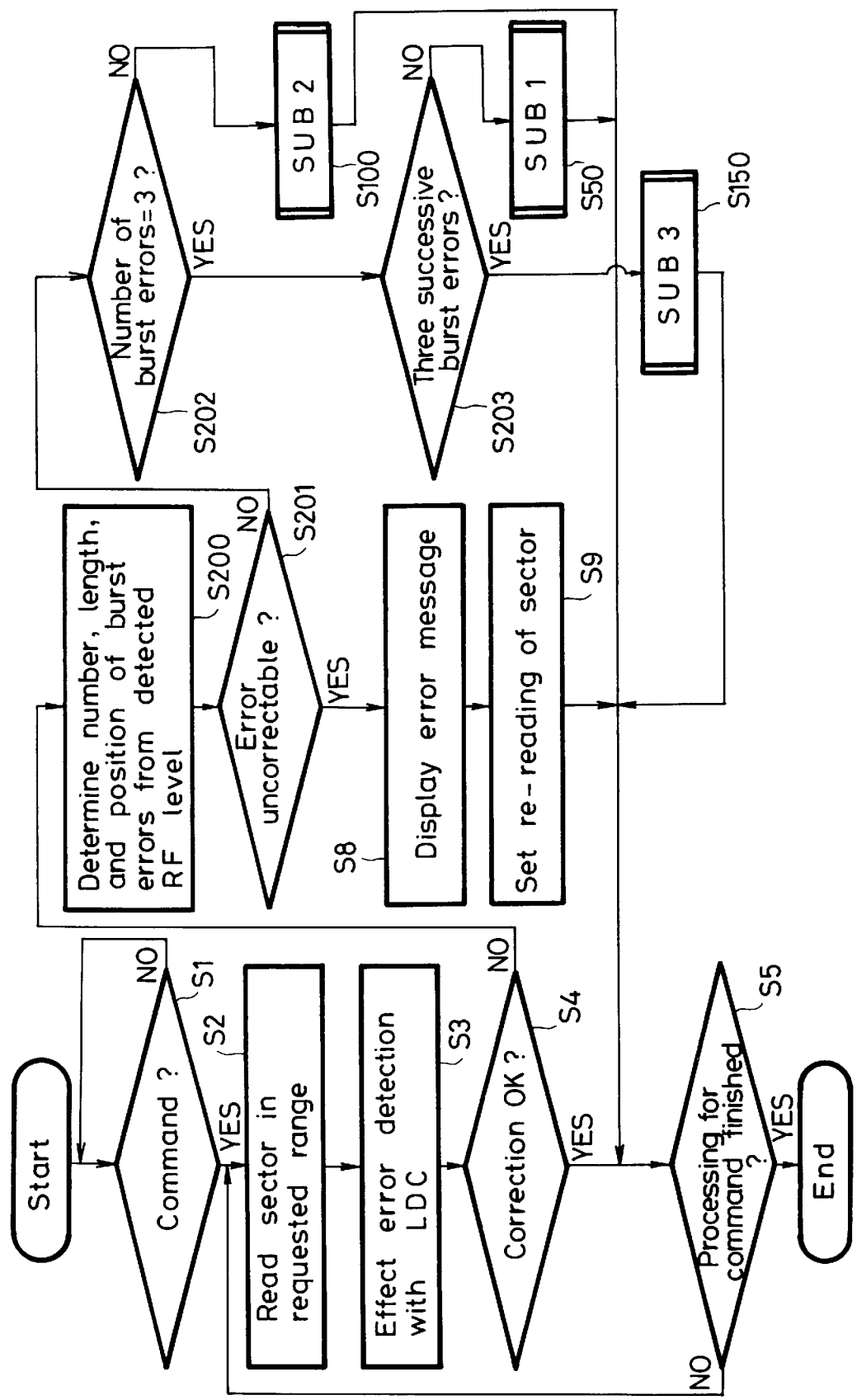
FIG. 16 is a flow chart of operation of the controller shown in FIG. 15.

FIG. 16 shows a sequence of operation of the controller shown in FIG. 15, for detecting a burst of errors, upon reproduction of data, by detecting an RF level instead of the second ECC. The flowchart shown in FIG. 16 corresponds to the flowchart shown in FIG. 10, and contains subroutines that are identical to those shown in FIGS. 11 through 13. Therefore, these subroutines will be omitted from illustration. Those steps shown in FIG. 16 which are identical to those shown in FIG. 10 are denoted by identical step numbers, and will not be described in detail below.

If the errors cannot be corrected as determined in step S4, then control goes to step S200 which determines the lengths and positions of bursts of errors from the detected RF level. Thereafter, control proceeds to step S201. In step S200, the burst detecting circuit 302 shown in FIG. 15 determines the number, lengths, and positions of bursts of errors in one sector based on the result of detection by the level detecting circuit 200 shown in FIG. 14.

Step S201 determines whether or not the error correction is OK. If the determination is "YES", then control goes to step S8, and if it is "NO", control goes to step S202. In step S202, errors are determined as being uncorrectable if the number of bursts of errors in one sector is at least "4".

The step S202 determines whether or not the number of bursts of errors is "3". If the determination is "YES", then control proceeds to step S203, and if it is "NO", then control goes to step S100 which is the subroutine SUB2. The number "3" used as the criterion in step S202 is essentially the same as the number of error flags in the previous embodiment.

Step S203 determines whether or not there are 3 successive bursts of errors. If the determination is "YES", then control goes to step S150 which is the subroutine SUB3, and if it is "NO", then control goes to step S50 which is the subroutine SUB1.

The processing in subroutines SUB1, SUB2 and SUB3 is the same as that in the previous embodiment. The rate of error correction can be increased by not using the second ECC. In this embodiment, the parity data P1~P40 as the second ECC are recorded in the same manner as with the previous embodiment. When they are used upon reproduction of data, the number of bytes that can be detected and corrected using the LDC can be increased up to a maximum of 16.

According to the present invention, data containing successive errors that cannot be corrected with an intersymbol minimum distance of first error-processing data can be recovered. Therefore, data which contains an uncorrectable burst of errors can be recovered through a simple process, resulting in an increased error-correcting capability for reliable data reproduction.

Furthermore, the present invention makes it possible to increase the error-correcting capability in the event of errors occurring over a plurality of blocks.

If errors occur over a plurality of blocks, then the data of at least one of the blocks, which is substantially central, and the data of blocks adjacent to the block are regarded as being erased, and errors are corrected using the first error-processing data. Consequently, in the event that errors occur over a plurality of blocks, the error-correcting capability is increased. Therefore, errors can be corrected efficiently for reproducing recorded data well, and the recording capacity of a recording medium is prevented from being lowered.

Although certain preferred embodiments of the present invention have been shown and described in detail, it should be understood that various changes and modifications may be made therein without departing from the scope of the appended claims.

What is claimed is:

1. A method of recording and reproducing data, comprising the steps of:
    (a) generating first error-processing data with respect to a predetermined amount of consecutive data, and generating second error-processing data with respect to each of a plurality of blocks produced by dividing said predetermined amount of consecutive data;
    (b) generating record units of data where each record unit of data is generated from said predetermined amount of consecutive data, said first error-processing data, and said second error-processing data;
    (c) recording each of said record units of data on a recording medium;
    (d) reproducing each of said record units of data from said recording medium;
    (e) processing error-correction in said predetermined amount of consecutive data in each of the reproduced record units of data with said first error-processing data with respect to each of said record units of data;
    (f) if errors cannot be corrected in step (e), at least detecting errors in said predetermined amount of consecutive data in each of said blocks with said second error-processing data; and
    (g) if errors are detected in N successive blocks (where N is a positive integer), processing error-correction in the predetermined amount of consecutive data in the record units of data with the first error processing data, regarding all data in at least one block of the N successive blocks, which is not positioned at an end of the N successive blocks, as erased data independently of a position of said errors, so as to produce reproduced data.

2. A method according to claim 1, wherein said second error-processing data is formed of a plurality of parity data in a direction corresponding to an order of data reproduced from said recording medium, with respect to the predetermined amount of consecutive data in said step (a).

3. A method according to claim 1, wherein step (g) comprises the step of processing error-correction in the predetermined amount of consecutive data in the record units of data with the first error-processing data regarding all data in at least one block of the N successive blocks which is not positioned at an end of the N successive blocks and portion of data of blocks adjacent to said at least one block, as erased data independently of a position of said errors.

4. A method according to claim 1, wherein step (g) comprises the steps of, if errors are detected in two successive blocks, processing error-correction in the predetermined amount of consecutive data in the record units of data with said first error-processing data regarding data corresponding to one block and extending over said two successive blocks as being erased data independently of a position of said errors, and if the errors cannot be corrected, positionally shifting the data of one block which is regarded as erased data, and processing error-correction again with said first error-processing data.

5. A method of transmitting data, comprising the steps of:
    (a) generating first error-processing data with respect to a predetermined amount of consecutive data, and generating second error-processing data with respect to each of a plurality of blocks produced by dividing said predetermined amount of consecutive data;
    (b) generating units of transmission data where each unit of transmission data is generated from said predetermined amount of consecutive data, said first error-processing data, and said second error-processing data;
    (c) transmitting each unit of transmission data;
    (d) processing error-correction in said units of transmission data which have been transmitted with said first error-processing data with respect to each unit of transmitted data;
    (e) if errors cannot be corrected in step (d), at least detecting errors in the units of transmitted data in each of said blocks with said second error-processing data; and (f) if errors are detected in N successive blocks (where N is an integer of at least 3), processing error-correction in the predetermined amount of consecutive data in the transmitted units of data with said first error-processing data, regarding all data in at least one block which is not positioned at an end of the N successive blocks, as being erased data independently of a position of said errors.

6. A method according to claim 5, wherein said second error-processing data generated in step (a) comprises a plurality of parity data in a direction corresponding to an order of data which is transmitted, with respect to said predetermined amount of consecutive data.

7. A method according to claim 5, wherein step (f) comprises the step of processing error-correction in the predetermined amount of data in the transmitted units of data with said first error-processing data, regarding all data in at least one block of the N successive blocks, which is not positioned at an end of those blocks, and portions of data of blocks adjacent to said at least one block, as being erased data independently of a position of said errors.

8. A method according to claim 5, wherein said step (f) comprises the step of, if errors are detected in two successive blocks, processing error-correction in the predetermined amount of consecutive data in the transmitted units of data with said first error-processing data, regarding data corresponding to one block and extending over said two successive blocks as being erased data independently of a position of said errors, and when the errors cannot be corrected, positionally shifting the data of one block which is regarded as erased data, and processing error-correction again with said first error-processing data.

9. An apparatus for recording and reproducing data, comprising:
   error-processing data generating means for generating first error-processing data with respect to a predetermined amount of consecutive data, and second error-processing data with respect to each of a plurality of blocks produced by dividing said predetermined amount of consecutive data;
   record unit data generating means for generating record units of data from said predetermined amount of consecutive data, said first error-processing data, and said second error-processing data;
   recording and reproducing means for recording said record units of data on a recording medium and reproducing said record units of data from said recording medium; and
   error correcting means for processing error-correction with respect to said predetermined amount of consecutive data in the record units of data reproduced by said recording and reproducing means with said first error-processing data, and if errors cannot be corrected, at least detecting errors in said predetermined amount of consecutive data in each of said blocks with said second error-processing data, and if errors are detected in N successive blocks (where N is a positive integer), processing error-correction in the predetermined amount of consecutive data in the record units of data with said first error-processing data regarding all data in at least one block which is not positioned at an end of the N successive blocks, as being erased data independently of a position of said errors.

10. An apparatus according to claim 9, wherein said error-processing data generating means generates as said second error-processing data a plurality of parity data in a direction corresponding to an order of data reproduced from said recording medium, with respect to said predetermined amount of consecutive data.

11. An apparatus according to claim 9, wherein said error correcting means processes error-correction in the predetermined amount of consecutive data in the record units of data with the first error-processing data, regarding all data in at least one block of the N successive blocks, which is not positioned at an end of the N successive blocks, and portions of data of blocks adjacent to said at least one block, as being erased data independently of a position of said errors.

12. An apparatus according to claim 9, wherein if errors are detected in two successive blocks, said error correcting means processes error-correction in the predetermined amount of consecutive data in the record units of data with said first error-processing data regarding data corresponding to one block and extending over said two successive blocks as erased data independently of a position of said errors, and, when the errors cannot be corrected, positionally shifts the data of one block which is regarded as erased data, and processes error-correction again with said first error-processing data.

13. An apparatus for transmitting data, comprising:
   error-processing data generating means for generating first error-processing data with respect to a predetermined amount of consecutive data, and second error-processing data with respect to each of a plurality of blocks produced by dividing said predetermined amount of consecutive data;
   transmission data generating means for generating units of transmission data where each unit of transmission data is generated from said predetermined amount of consecutive data, said first error-processing data, and said second error-processing data;
   transmitting means for transmitting each unit of transmission data; and
   error correcting means for processing error-correction with respect to each of the units of transmission data which have been transmitted with said first error-processing data, and if errors cannot be corrected, at least detecting errors in the transmitted units of transmission data in each of said blocks with said second error-processing data, and if errors are detected in N successive blocks (where N is an integer of at least 3), processing error-correction in the predetermined amount of consecutive data in the transmitted units of transmission data with said first error-processing data, regarding all data in at least one block of the N successive blocks, which is not positioned at an end of the N successive blocks, as being erased data independently of a position of said errors.

14. An apparatus according to claim 13, wherein said error-processing data generating means generates a plurality of parity data in a direction corresponding to an order of data which are transmitted, with respect to said predetermined amount of consecutive data as said second error-processing data.

15. An apparatus according to claim 13, wherein said error correcting means processes error-correction in the predetermined amount of data in the transmitted unit of transmission data with said first error-processing data, regarding all data in at least one block of the N successive blocks, which is not positioned at an end of the N successive blocks, and portions of data of blocks adjacent to said at least one block, as being erased data independently of a position of said errors.

16. An apparatus according to claim 13, wherein if errors are detected in two successive blocks, said error correcting means processes error-correction in the predetermined amount of consecutive data in the transmitted units of transmission data with said first error-processing data regarding data corresponding to one block and extending over said two successive blocks as being erased independently of a position of said errors and, when the errors cannot be corrected, positionally shifts the data of one block which is regarded as erased data, and processes error-correction again with said first error-processing data.

17. A method of reproducing data, comprising the steps of:

(a) reproducing record units of data from a recording medium on which there are recorded a predetermined amount of consecutive data, first error-processing data generated with respect to said predetermined amount of consecutive data, and second error-processing data generated with respect to each of a plurality of blocks produced by dividing said predetermined amount of consecutive data, making up said record units of data;

(b) processing error-correction in said predetermined amount of consecutive data in the reproduced record units of data with said first error-processing data with respect to each said record unit of data;

(c) if errors cannot be corrected in step (b), at least detecting errors in said predetermined amount of consecutive data in each of said blocks with said second error-processing data; and (d) if errors are detected in N successive blocks (where N is a positive integer), processing error-correction in the predetermined amount of consecutive data in the record units of data with said first error-processing data regarding all data in at least one block of the N successive blocks which is not positioned at an end of the N successive blocks, as being erased data independently of a position of said errors, so as to produce reproduced data.

18. A method according to claim 17, wherein said second error-processing data is formed of a plurality of parity data in a direction corresponding to an order of data reproduced from said recording medium, with respect to the predetermined amount of consecutive data in step (a).

19. A method according to claim 17, wherein step (d) comprises the step of processing error-correction in the predetermined amount of consecutive data in the record units of data with said first error-processing data, regarding all data in at least one block of the N successive blocks, which is not positioned at an end of the N successive blocks, and portions of data of blocks adjacent to said at least one block, as being erased data independently of a position of said errors.

20. A method according to claim 17, wherein if errors are detected in two successive blocks, step (d) comprises the steps of, processing error-correction in the predetermined amount of consecutive data in the record units of data with said first error-processing data, regarding data corresponding to one block and extending over said two successive blocks as erased data independently of a position of said errors, and, if the errors cannot be corrected, positionally shifting the data of one block which is regarded as erased data, and processing error-correction again with said first error-processing data.

21. A method of transmitting data, comprising the steps of:

(a) transmitting a unit of transmission data which is composed of a predetermined amount of consecutive data, first error-processing data generated with respect to said predetermined amount of consecutive data, and second error-processing data generated with respect to each of a plurality of blocks produced by dividing said predetermined amount of consecutive data;

(b) processing error-correction in each unit of transmission data which is transmitted with said first error-processing data with respect to each transmitted unit of transmission data;

(c) if errors cannot be corrected in step (b), at least detecting errors in the units of transmission data in each of said blocks with said second error-processing data; and (d) if errors are detected in N successive blocks (where N is an integer of at least 3), processing error-correction in the predetermined amount of consecutive data in the transmitted units of transmission data with said first error-processing data regarding all data in at least one block, which is not positioned at an end of the N successive blocks, as being erased data independently of a position of said errors.

22. An apparatus for reproducing data, comprising:

reproducing means for reproducing a record unit of data from a recording medium on which there are recorded a predetermined amount of consecutive data, first error-processing data generated with respect to said predetermined amount of consecutive data, and second error-processing data generated with respect to each of a plurality of blocks produced by dividing said predetermined amount of consecutive data, making up said record unit of data;

error-correction processing means for processing error-correction in said predetermined amount of consecutive data in the record unit of data reproduced by said reproducing means, with said first error-processing data with respect to each record unit of data, and if errors cannot be corrected, at least detecting errors in said predetermined amount of consecutive data in each of said blocks with said second error-processing data, and if errors are detected in N successive blocks (where N is a positive integer), processing error-correction in the predetermined amount of consecutive data in the record unit of data with said first error-processing data regarding all data in at least one block which is not positioned at an end of the N successive blocks, as erased data independently of a position of said errors.

23. An apparatus for recording and reproducing data, comprising:

error-processing data generating means for generating first error-processing data with respect to a predetermined amount of consecutive data, and second error-processing data with respect to each of a plurality of blocks produced by dividing said predetermined amount of consecutive data;

record unit data generating means for generating a record unit of data from said predetermined amount of consecutive data, said first error-processing data, and said second error-processing data;

recording and reproducing means for recording said record unit of data on a recording medium and reproducing said record unit of data from said recording medium;

error detecting means for detecting in each of said block an error status of a reproduced signal indicative of the record unit of data which is reproduced by said recording and reproducing means, based on a video level of said reproduced signal; and error-correction processing means for processing error-correction in said predetermined amount of consecutive data in the record unit of data reproduced by said recording and reproducing means, with said first error-processing data with respect to each record unit of data, and if errors cannot be corrected with said first error-processing data with respect to each record unit of data, determining blocks as errors based on the error status detected by said error detecting means, and when N successive blocks are determined as error (where N is a positive integer), processing error-correction in the predetermined amount of data in the record units of data with said first error-processing data, regarding all data in at least one block, which is not positioned at an end of the N successive blocks, as being erased independently of a position of said errors.

24. An apparatus for reproducing data, comprising:

reproducing means for reproducing record units of data from a recording medium on which there are recorded a predetermined amount of consecutive data, first error-processing data generated with respect to said predetermined amount of consecutive data, and second error-processing data generated with respect to each of a plurality of blocks produced by dividing said predetermined amount of consecutive data, making up said data of record units of data;

error detecting means for detecting in each of said block an error status of a reproduced signal indicative of the record units of data which are reproduced by said reproducing means, based on a video level of said reproduced signal; and error-correction processing means for processing error-correction in said predetermined amount of consecutive data in the record units of data reproduced by said reproducing means, with said first error-processing data with respect to each of said record units of data, and if errors cannot be corrected, determining blocks as errors based on the error status detected by said error detecting means, and when N successive blocks are determined as error (where N is a positive integer), processing error-correction in the predetermined amount of data in the record unit of data with said first error-processing data regarding all data in at least one block, which is not positioned at an end of the N successive blocks, as being erased data independently of a position of said errors.

* * * * *

UNITED STATES PATENT AND TRADEMARK OFFICE
CERTIFICATE OF CORRECTION

PATENT NO.: 5,835,509
DATED: 11/10/98
INVENTOR(S): YOICHIRO SAKO ET AL.

It is certified that errors appear in the above-identified patent and that said Letters Patent is hereby corrected as shown below:

On the title page, item [54] and column 1:

In the Title of the Invention, the title should read --METHOD OF AND APPARATUS FOR RECORDING, REPRODUCING AND TRANSMITTING DATA--.

In Col. 26, line 36, "portion" should be --portions--.

Signed and Sealed this

Twenty-third Day of March, 1999

Attest:

Q. TODD DICKINSON

Attesting Officer

Acting Commissioner of Patents and Trademarks